US010943861B2

(12) United States Patent
Ise et al.

(10) Patent No.: US 10,943,861 B2
(45) Date of Patent: Mar. 9, 2021

(54) SEMICONDUCTOR DEVICE

(71) Applicant: Rohm Co., Ltd., Kyoto (JP)

(72) Inventors: Kota Ise, Kyoto (JP); Koshun Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/694,470

(22) Filed: Nov. 25, 2019

(65) Prior Publication Data

US 2020/0176371 A1 Jun. 4, 2020

(30) Foreign Application Priority Data

Nov. 30, 2018 (JP) .............................. JP2018-224872

(51) Int. Cl.
*H01L 23/495* (2006.01)
*H01L 23/498* (2006.01)
*H01L 23/31* (2006.01)
*H01L 23/00* (2006.01)

(52) U.S. Cl.
CPC .... *H01L 23/49861* (2013.01); *H01L 23/3114* (2013.01); *H01L 23/49811* (2013.01); *H01L 24/45* (2013.01); *H01L 23/49562* (2013.01); *H01L 2924/12* (2013.01); *H01L 2924/1304* (2013.01)

(58) Field of Classification Search
USPC ........................................... 257/99, 433, 666
See application file for complete search history.

(56) References Cited

U.S. PATENT DOCUMENTS

2012/0025260 A1* 2/2012 Oonakahara ............ H01L 33/62
257/99
2018/0019386 A1* 1/2018 Lee ....................... H01L 33/647

FOREIGN PATENT DOCUMENTS

JP            2005-277231 A      10/2005

* cited by examiner

*Primary Examiner* — Brook Kebede
(74) *Attorney, Agent, or Firm* — Hamre, Schumann, Mueller & Larson, P.C.

(57) ABSTRACT

A semiconductor device includes a semiconductor element, a first lead supporting the semiconductor element, a second lead separated from the first lead, and a connection lead electrically connecting the semiconductor element to the second lead. The connection lead has an end portion soldered to the second lead. This connection-lead end portion has a first surface facing the semiconductor element and a second surface opposite to the first surface. The second lead is formed with a recess that is open toward the semiconductor element. The recess has a side surface facing the second surface of the connection-lead end portion. A solder contact area of the second surface of the connection-lead end portion is larger than a solder contact area of the first surface of the connection-lead end portion.

17 Claims, 17 Drawing Sheets

SEMICONDUCTOR DEVICE

TECHNICAL FIELD

The present disclosure relates to a semiconductor device.

BACKGROUND

Various configurations have been proposed for producing semiconductor devices. For instance, JP-A-2005-277231 discloses a conventional semiconductor device, which includes a semiconductor element, a first lead, a second lead, a connection lead, and a sealing resin. The semiconductor element is mounted on and electrically connected to the first lead, while being connected to the second lead via the connection lead. The connection lead has an end bonded to the second lead by solder, for example.

The soldering of the connection lead to the second lead may be performed using a reflow process. In this case, the connection lead may be unduly displaced relative to the semiconductor element and/or the second lead during the process, thereby resulting in improper electrical connection of the connection lead to the semiconductor element and/or the second lead.

SUMMARY

In the above circumstances, it is an object of the present disclosure to provide a semiconductor device configured to suppress displacement of a connection lead. According to an aspect of the present disclosure, there is provided a semiconductor device including a semiconductor element, a first lead, a second lead, and a connection lead. The semiconductor element has an element main surface and an element back surface that face mutually opposite sides in a thickness direction, while also having a first electrode disposed on the element back surface and a second electrode disposed on the element main surface. The first lead is joined to the first electrode of the semiconductor element, and the second lead that is electrically connected to the second electrode. The connection lead includes an element connecting portion joined to the second electrode and a lead connecting portion joined to the second lead by solder. The lead connecting portion includes: a lead-connecting-portion first surface that faces the semiconductor element in a first direction orthogonal to the thickness direction; a lead-connecting-portion second surface that faces opposite to the lead-connecting-portion first surface; and a lead-connecting-portion end surface that is connected to the lead-connecting-portion first surface and the lead-connecting-portion second surface, where the lead-connecting-portion end surface faces the element back surface in the thickness direction. The second lead includes a connecting portion recess that includes a first recess side surface facing the lead-connecting-portion second surface and a recess bottom surface facing the lead-connecting-portion end surface. The connecting portion recess is open toward the semiconductor element in the first direction. An area of a second contact region in which the lead-connecting-portion second surface and solder are in contact with each other is larger than an area of a first contact region in which the lead-connecting-portion first surface and solder are in contact with each other.

In a semiconductor device according to the present disclosure, the area of the second contact region is larger than the area of the first contact region. Accordingly, the second surface of the connection lead is drawn toward the first recess side surface of the second lead by the surface tension of molten solder in the reflow process. As a result, the connection lead is disposed at a predetermined position relative to the second lead, whereby displacement of the connection lead can be suppressed.

Other features and advantages of the present disclosure will be apparent from the detailed description given below with reference to the accompanying drawings.

EMBODIMENTS

The following describes embodiments of the present disclosure with reference to the accompanying drawings.

Figure 1:
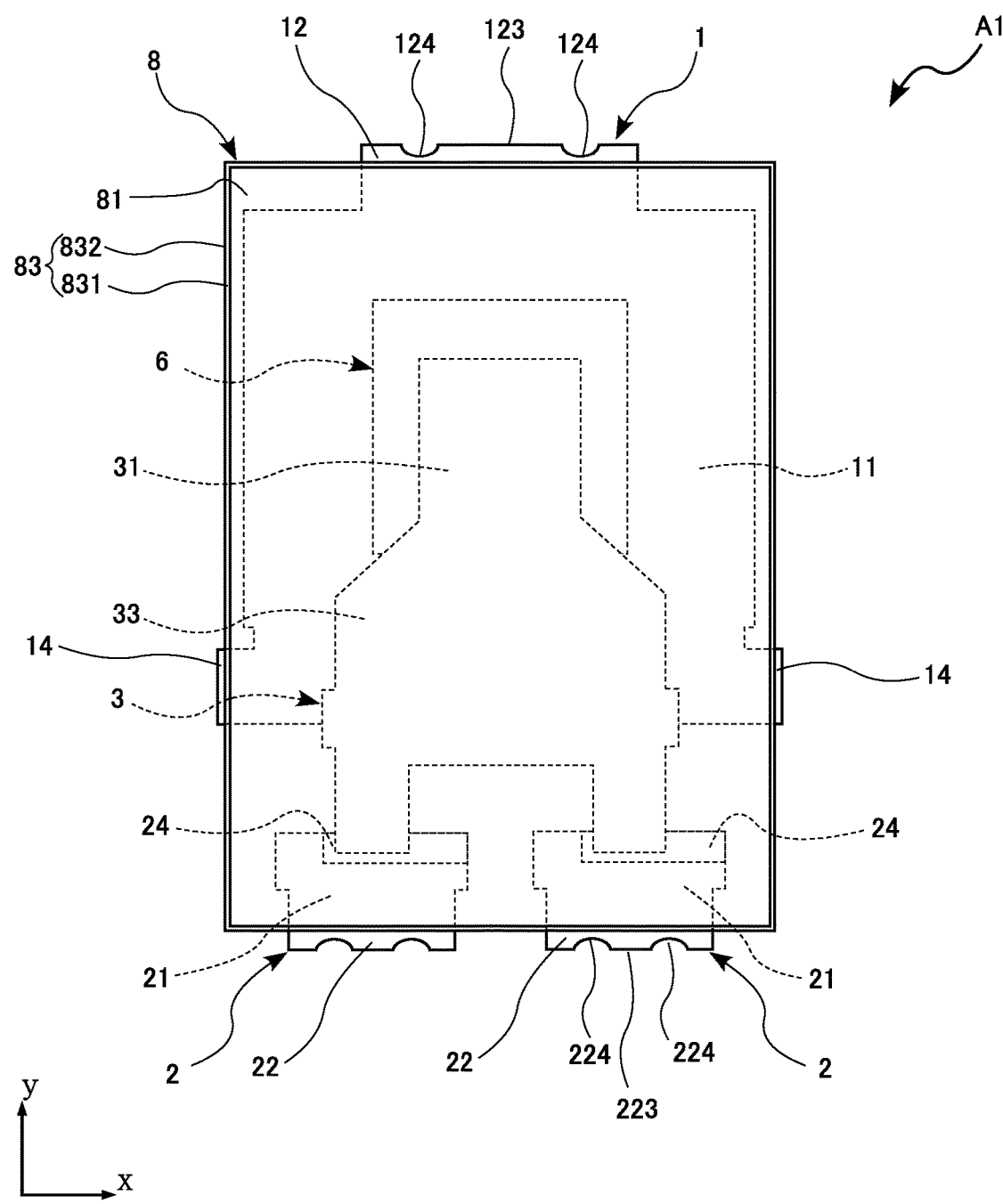
FIG. 1 is a plan view showing a semiconductor device according to a first embodiment of the present disclosure.
Figure 2:
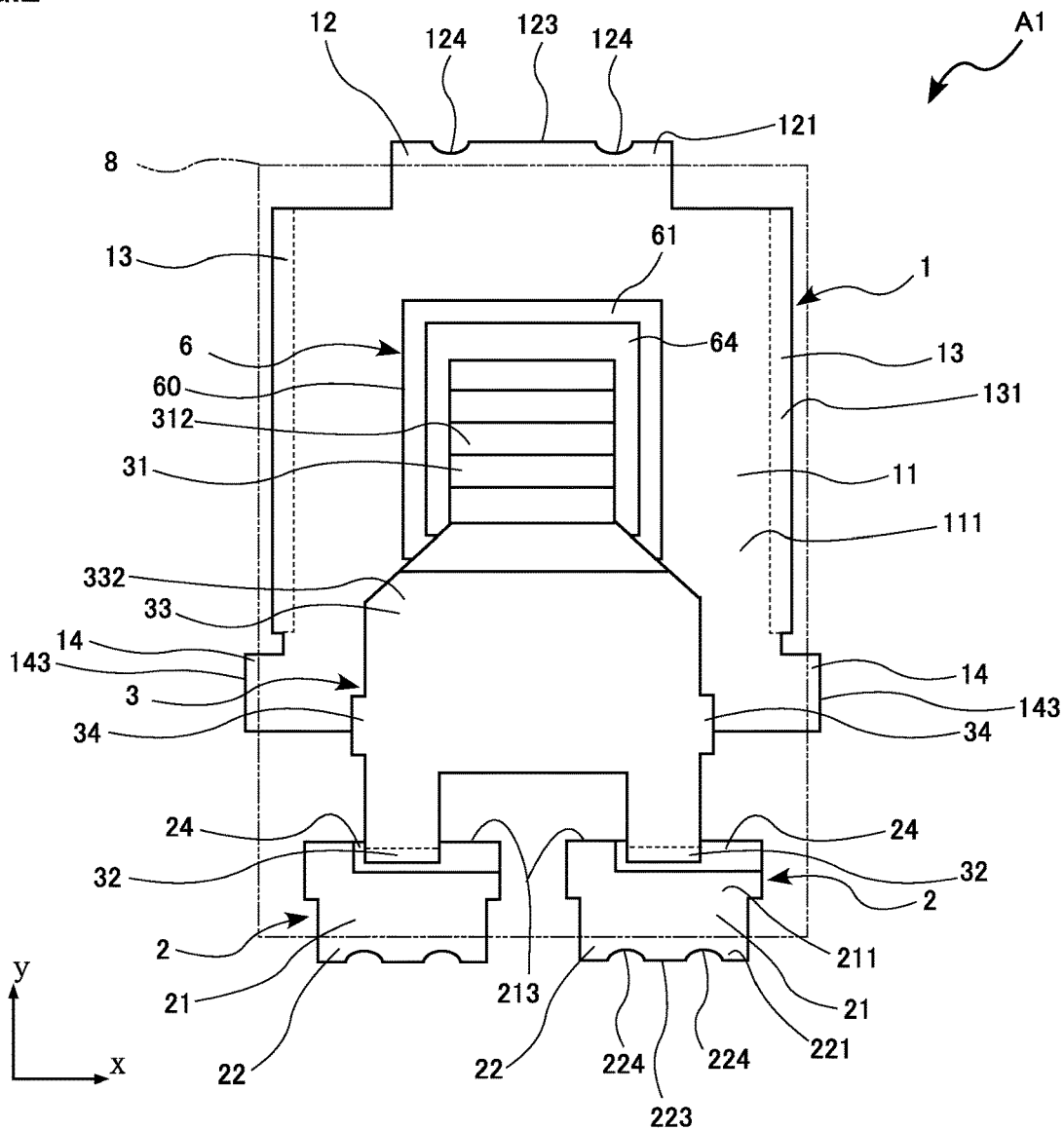
FIG. 2 is a plan view showing the inside of the semiconductor device shown in FIG. 1 in a transparent view.
Figure 3:
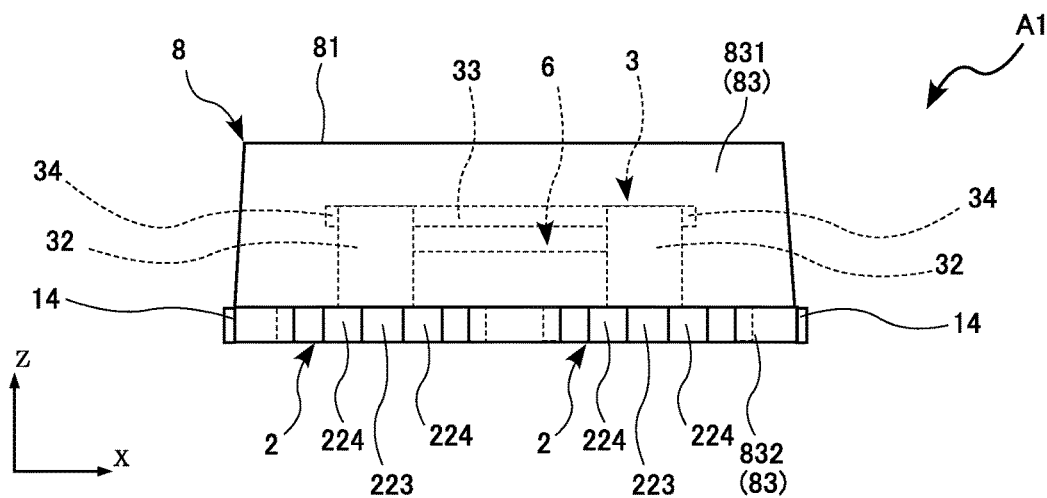
FIG. 3 is a front view of the semiconductor device shown in FIG. 1.
Figure 4:
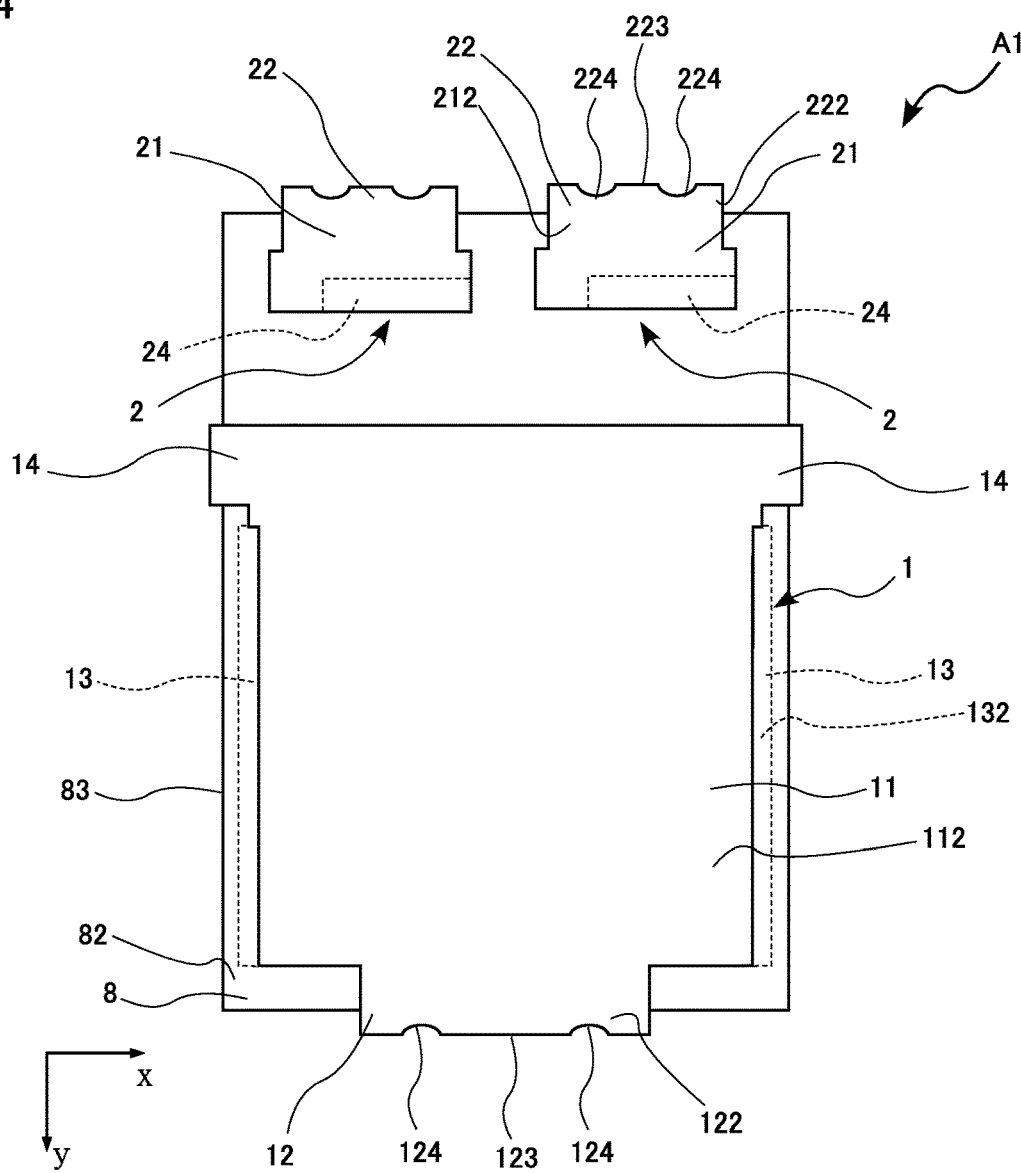
FIG. 4 is a bottom view of the semiconductor device shown in FIG. 1.
Figure 5:
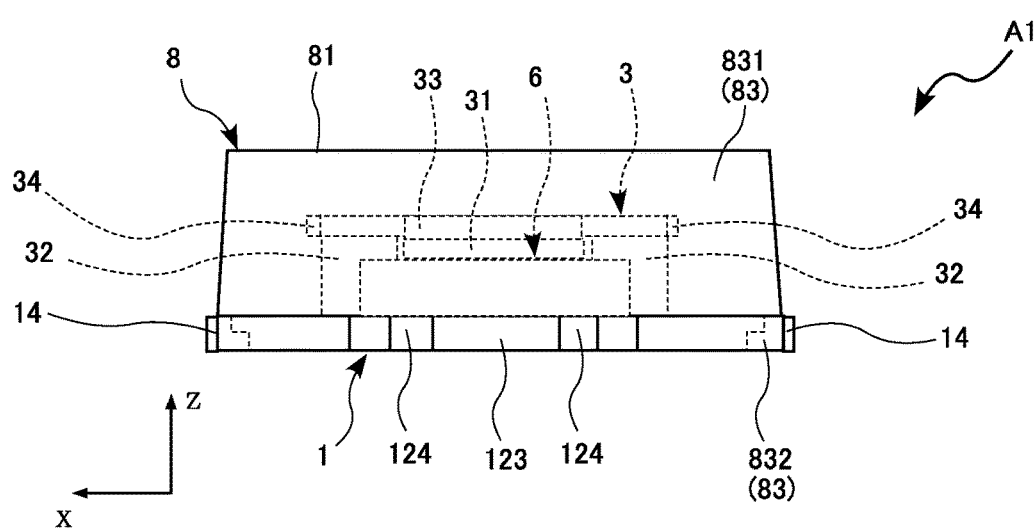
FIG. 5 is a back view of the semiconductor device shown in FIG. 1.
Figure 6:
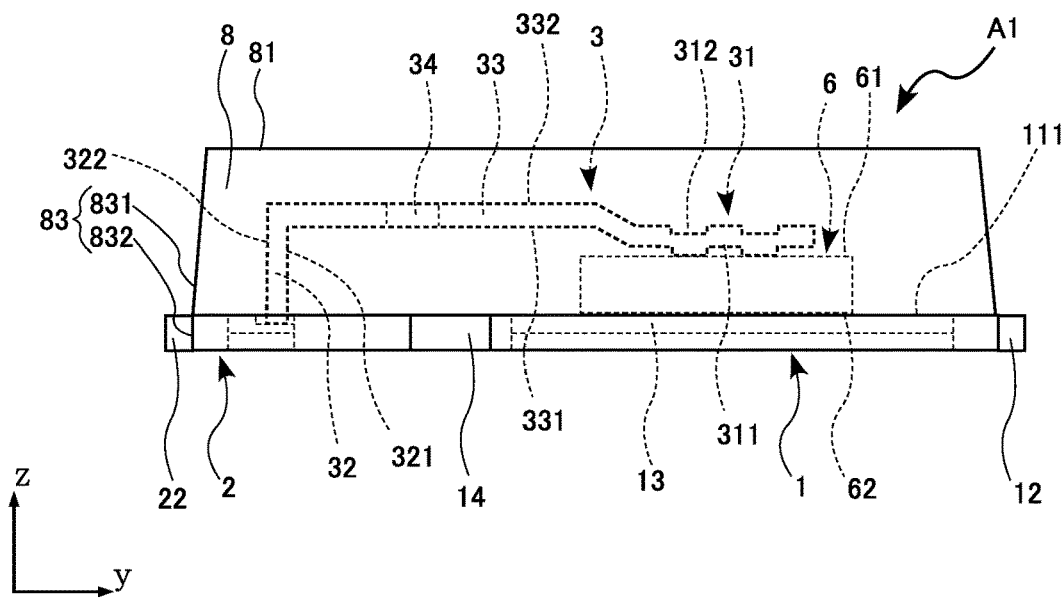
FIG. 6 is a right-side view of the semiconductor device shown in FIG. 1.
Figure 7:
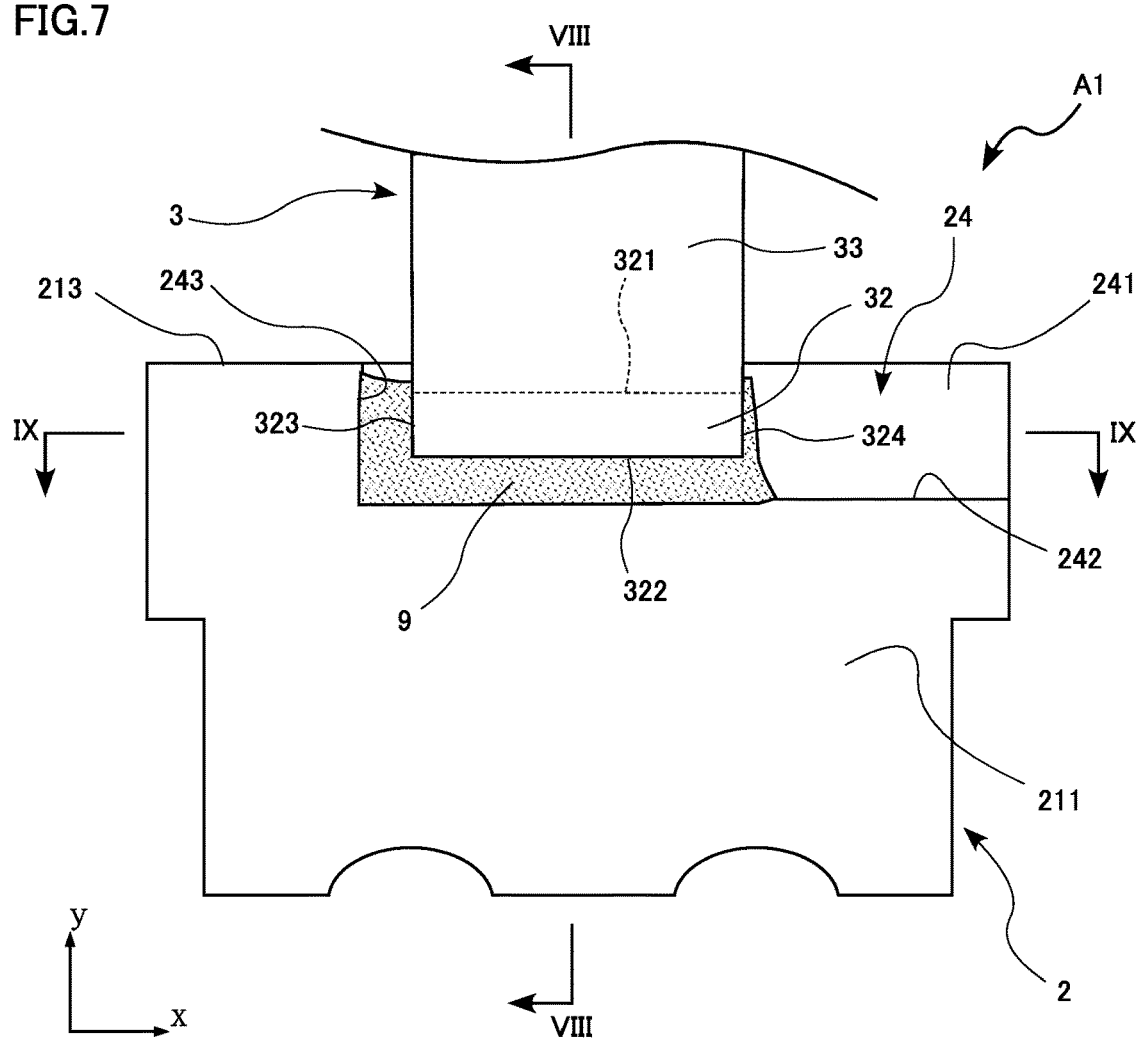
FIG. 7 is an enlarged plan view showing a main portion of the semiconductor device shown in FIG. 1.
Figure 8:
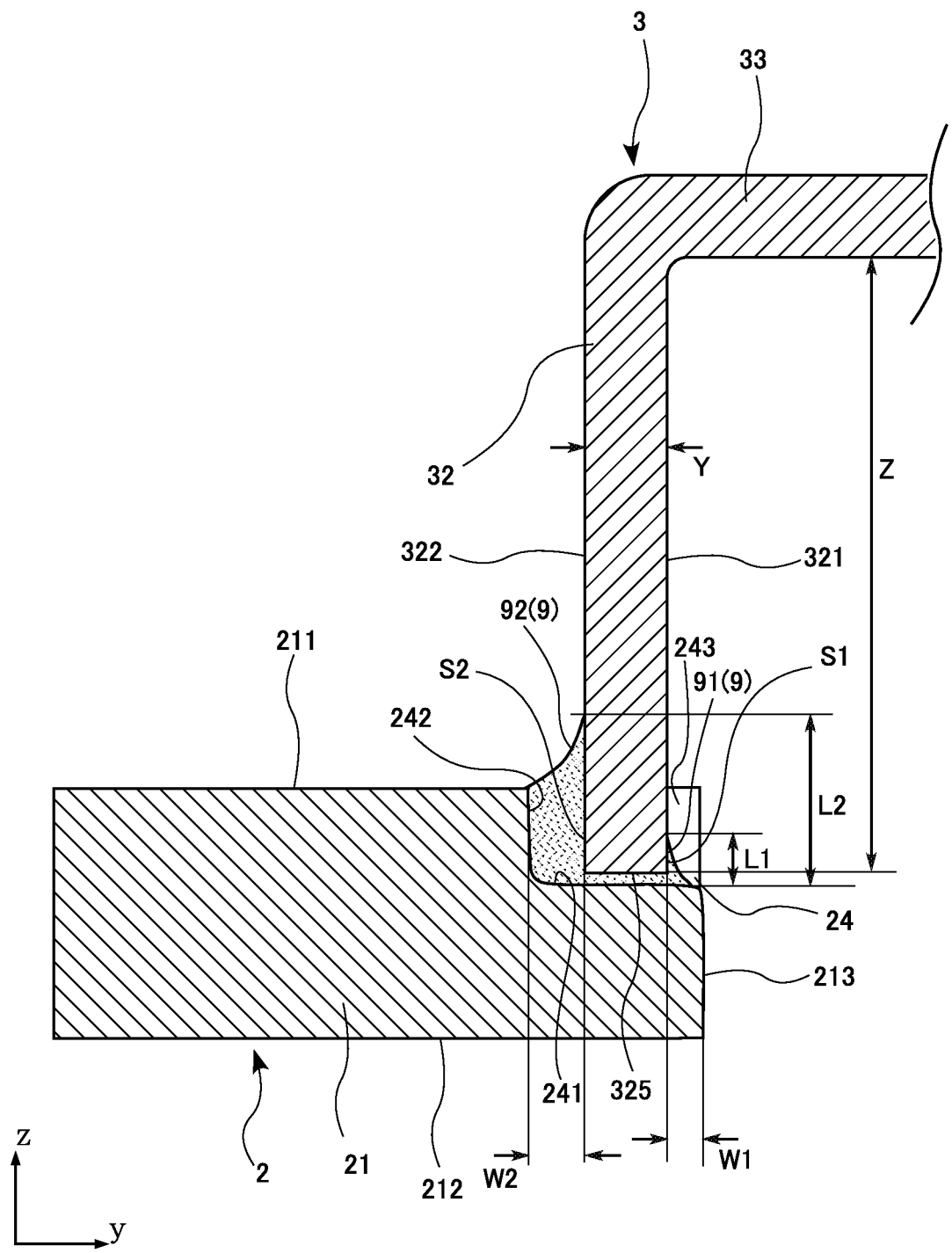
FIG. 8 is a cross-sectional view taken along line VIII-VIII in FIG. 7.
Figure 9:
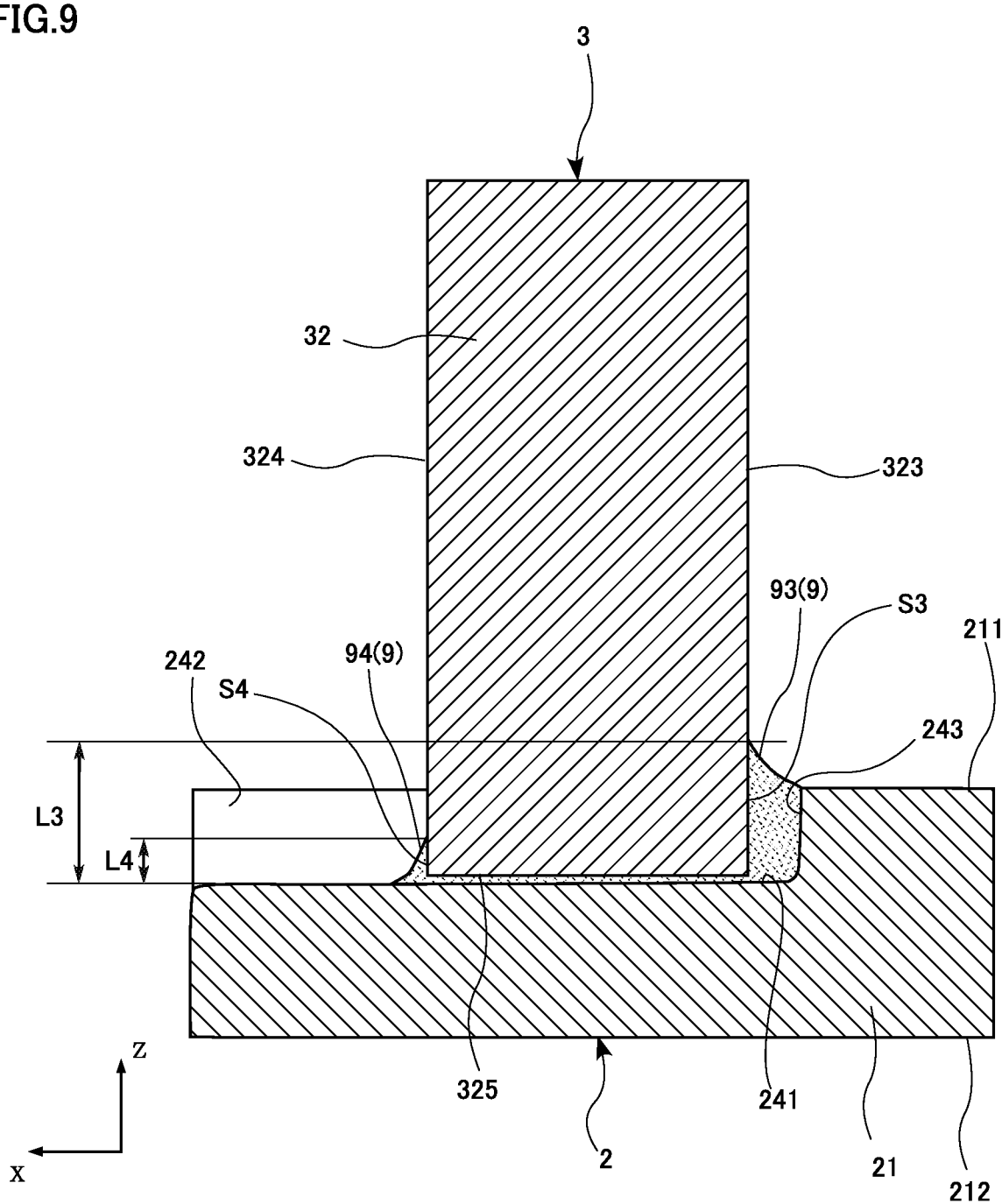
FIG. 9 is a cross-sectional view taken along line IX-IX in FIG. 7.

A semiconductor device A1 according to a first embodiment of the present disclosure will be described based on FIGS. 1 to 9. The semiconductor device A1 includes a first lead 1, two second leads 2, a connection lead 3, a semiconductor element 6, and a sealing resin 8. FIG. 1 is a plan view showing the semiconductor device A1. FIG. 2 is a plan view showing the inside of the semiconductor device A1 in a transparent view. In FIG. 2, the sealing resin 8 is transparent and the external shape of the sealing resin 8 is indicated by an imaginary line (line-double-dash line) in order to facilitate understanding. FIG. 3 is a front view showing the semiconductor device A1. FIG. 4 is a bottom view showing the semiconductor device A1. FIG. 5 is a back view showing the semiconductor device A1. FIG. 6 is a right-side view showing the semiconductor device A1. FIG. 7 is an enlarged plan view showing a main portion of the semiconductor device A1. FIG. 8 is a cross-sectional view taken along line VIII-VIII in FIG. 7. FIG. 9 is a cross-sectional view taken along line IX-IX in FIG. 7. In FIGS. 7 to 9, the sealing resin 8 is omitted in order to facilitate understanding.

The semiconductor device A1 shown in these figures is a device that is surface mounted on a circuit board in various apparatuses. The semiconductor device A1 has a rectangular shape when viewed in the thickness direction. For the sake of convenience of description, the thickness direction of the semiconductor device A1 will be referred to as the z direction, a direction (left-right direction in FIG. 1) that is orthogonal to the z direction and extends along one side of the semiconductor device A1 will be referred to as the x direction, and a direction (up-down direction in FIG. 1) that is orthogonal to the z and x directions will be referred to as the y direction. The same also applies to the other figures. The z direction corresponds to a "thickness direction" in the present disclosure, and the y direction corresponds to a "first direction" in the present disclosure. Dimensions of the semiconductor device A1 are not particularly limited, and the semiconductor device A1 of the present embodiment has, for example, a length of about 2 to 6 mm in the x direction, a length of about 2 to 6 mm in the y direction, and a length of about 0.5 to 1 mm in the z direction.

The first lead 1 supports the semiconductor element 6 and is electrically connected to the semiconductor element 6. The second leads 2 are electrically connected to the semiconductor element 6. The first lead 1 and the second leads 2 are formed by punching or etching a metal plate, for example. The first lead 1 and the second leads 2 are made of metal, which is preferably Cu, Ni, an alloy of Cu or Ni, or a 42 alloy. The present embodiment describes a case in which the first lead 1 and the second leads 2 are made of Cu. The thickness of the first lead 1 and the second leads 2 is 0.08 to 0.3 mm, for example, and is about 0.25 mm in the present embodiment.

As shown in FIG. 2, the first lead 1 is disposed at one end (upper side in FIG. 2) of the semiconductor device A1 in the y direction, and extends over the entire length of the semiconductor device A1 in the x direction. The two second leads 2 are disposed side by side in the x direction at the other end (lower side in FIG. 2) of the semiconductor device A1 in the y direction so as to be spaced apart from each other and spaced apart from the first lead 1.

The first lead 1 includes a mounting portion 11, a first lead terminal portion 12, thin portions 13, and tie bar portions 14.

The mounting portion 11 is located at the center of the first lead 1 when viewed in the z direction, and has a substantially rectangular shape when viewed in the z direction. The mounting portion 11 has a mounting portion main surface 111 and a mounting portion back surface 112. The mounting portion main surface 111 and the mounting portion back surface 112 face mutually opposite sides in the z direction. The mounting portion main surface 111 faces upward in FIGS. 3, 5, and 6. The semiconductor element 6 is mounted on the mounting portion main surface 111. The mounting portion back surface 112 faces downward in FIGS. 3, 5, and 6. The mounting portion back surface 112 is exposed from the sealing resin 8 and serves as a back surface terminal (see FIG. 4). Note that the shape of the mounting portion 11 is not limited.

The first lead terminal portion 12 is continuous to the mounting portion 11 and has a substantially rectangular shape when viewed in the z direction. The first lead terminal portion 12 is disposed on one end side (upper side in FIG. 2) of the mounting portion 11 in the y direction. The first lead terminal portion 12 has a first-lead-terminal-portion main surface 121, a first-lead-terminal-portion back surface 122, and a first-lead-terminal-portion end surface 123. The first-lead-terminal-portion main surface 121 and the first-lead-terminal-portion back surface 122 face mutually opposite sides in the z direction. The first-lead-terminal-portion main surface 121 faces upward in FIGS. 3, 5, and 6. The first-lead-terminal-portion main surface 121 and the mounting portion main surface 111 are flush with each other (see FIG. 2). The first-lead-terminal-portion back surface 122 faces downward in FIGS. 3, 5, and 6. The first-lead-terminal-portion back surface 122 and the mounting portion back surface 112 are flush with each other (see FIG. 4). The first-lead-terminal-portion end surface 123 connects the first-lead-terminal-portion main surface 121 and the first-lead-terminal-portion back surface 122 to each other, and faces one side (upper side in FIG. 2) in the y direction. The first-lead-terminal-portion end surface 123 protrudes from the sealing resin 8. The first-lead-terminal-portion back surface 122 and the first-lead-terminal-portion end surface 123 are exposed from the sealing resin 8, are continuous to each other, and serve as a terminal. Note that the shape of the first lead terminal portion 12 is not limited.

The thin portions 13 are continuous to the mounting portion 11, and are respectively disposed at opposite ends of the mounting portion 11 in the x direction when viewed in the z direction. The thickness (length in the z direction) of the thin portions 13 is about half the thickness of the mounting portion 11. The thin portions 13 are formed through half-etching, for example. The thin portions 13 each have a thin portion main surface 131 and a thin portion back surface 132. The thin portion main surface 131 and the thin portion back surface 132 face mutually opposite sides in the z direction. The thin portion main surface 131 faces upward in FIGS. 3, 5, and 6. The thin portion main surface 131 and the mounting portion main surface 111 are flush with each other. Accordingly, the mounting portion main surface 111, the first-lead-terminal-portion main surface 121, and the thin portion main surfaces 131 are flush with each other and constitute a single surface (see FIG. 2). The thin portion back surfaces 132 face downward in FIGS. 3, 5, and 6. The thin portion back surfaces 132 are not exposed from the sealing resin 8, and the thin portions 13 are embedded in the sealing resin 8. Thus, separation of the first lead 1 from the sealing resin 8 is suppressed. Note that a configuration is also possible in which the first lead 1 does not include the thin portions 13.

The tie bar portions 14 are continuous to the mounting portion 11, and are respectively disposed at opposite ends of the mounting portion 11 in the x direction on the other end side (lower side in FIG. 2) in the y direction. Portions of the tie bar portions 14 protrude from the sealing resin 8. The tie bar portions 14 are portions that remain after tie bars that connect the mounting portion 11 of the first lead 1 to a lead frame are cut. Each tie bar portion 14 has an end surface 143. The end surface 143 faces the x direction and is a cut surface that is formed by cutting the tie bar.

In the present embodiment, the first lead 1 includes two end surface recesses 124 that are recessed from the first-lead-terminal-portion end surface 123. The end surface recesses 124 are respectively disposed between the center of the first-lead-terminal-portion end surface 123 and opposite ends thereof in the x direction. The end surface recesses 124 span between opposite ends of the first-lead-terminal-portion end surface 123 in the z direction. The end surface recesses 124 are formed by providing through holes in the lead frame and cutting the lead frame across the through holes in the manufacturing process, as described later.

Each second lead 2 includes a connecting portion 21 and a second lead terminal portion 22.

The connecting portion 21 has a substantially rectangular shape when viewed in the z direction, and is located on the first lead 1 side of the second lead 2. The connecting portion 21 has a connecting portion main surface 211, a connecting portion back surface 212, and a connecting portion side surface 213. The connecting portion main surface 211 and the connecting portion back surface 212 face mutually opposite sides in the z direction. The connecting portion main surface 211 faces upward in FIGS. 3, 5, and 6. The connecting portion back surface 212 faces downward in FIGS. 3, 5, and 6. The connecting portion back surface 212 is exposed from the sealing resin 8 and serves as a back surface terminal (see FIG. 4). The connecting portion side surface 213 connects the connecting portion main surface 211 and the connecting portion back surface 212 to each other, and faces the first lead 1 side in the y direction.

Each connecting portion 21 includes a connecting portion recess 24. The connecting portion recess 24 is recessed from the connecting portion main surface 211 toward the connecting portion back surface 212, and has a rectangular shape when viewed in the z direction. In the present embodiment, the connecting portion recess 24 is formed through half-etching. Note that the connecting portion recess 24 may also be formed through pressing. The connecting portion recess 24 is disposed in the end portion (upper end portion in FIG. 2) of the connecting portion main surface 211 on the first lead 1 side in the y direction and in one end portion (right end portion in FIG. 2) of the connecting portion main surface 211 in the x direction. The connecting portion recess 24 is open on the first lead 1 side (upper side in FIG. 2) in the y direction and on one side (right side in FIG. 2) in the x direction, and has a recess bottom surface 241, a first recess side surface 242, and a second recess side surface 243. The recess bottom surface 241 is a rectangular surface that faces one side (upper side in FIG. 6) in the z direction (see FIGS. 7 to 9). The first recess side surface 242 is a rectangular surface that is orthogonal to the recess bottom surface 241 and faces one side (upper side in FIG. 2) in the y direction (see FIGS. 7 and 8). The second recess side surface 243 is a rectangular surface that is orthogonal to the recess bottom surface 241 and the first recess side surface 242 and faces one side (right side in FIG. 2) in the x direction (see FIGS. 7 and 9). A lead connecting portion 32 of the connection lead 3 is joined to the connecting portion recess 24.

Note that, similarly to the first lead 1, each second lead 2 may be provided with thin portions that are continuous to the connecting portion 21 and are embedded in the sealing resin 8. Also, the connecting portions 21 are only required to include the connecting portion recess 24, and the shape of the connecting portions 21 is not limited.

Each second lead terminal portion 22 is continuous to the connecting portion 21 and has a substantially rectangular shape when viewed in the z direction. The second lead terminal portion 22 is located on the side opposite to the first lead 1 with respect to the connecting portion 21, and is disposed on the other end side (lower side in FIG. 2) in the y direction. The second lead terminal portion 22 has a second-lead-terminal-portion main surface 221, and a second-lead-terminal-portion back surface 222, and a second-lead-terminal-portion end surface 223. The second-lead-terminal-portion main surface 221 and the second-lead-terminal-portion back surface 222 face mutually opposite sides in the z direction. The second-lead-terminal-portion main surface 221 faces upward in FIGS. 3, 5, and 6. The second-lead-terminal-portion main surface 221 and the connecting portion main surface 211 are flush with each other (see FIG. 2). The second-lead-terminal-portion back surface 222 faces downward in FIGS. 3, 5, and 6. The second-lead-terminal-portion back surface 222 and the connecting portion back surface 212 are flush with each other (see FIG. 4). The second-lead-terminal-portion end surface 223 connects the second-lead-terminal-portion main surface 221 and the second-lead-terminal-portion back surface 222 to each other, and faces the other side (lower side in FIG. 2) in the y direction. The second-lead-terminal-portion end surface 223 protrudes from the sealing resin 8. The second-lead-terminal-portion back surface 222 and the second-lead-terminal-portion end surface 223 are exposed from the sealing resin 8, are continuous to each other, and serve as a terminal. Note that the shape of the second lead terminal portion 22 is not limited.

In the present embodiment, each second lead 2 includes two end surface recesses 224 that are recessed from the second-lead-terminal-portion end surface 223. The end surface recesses 224 are respectively disposed between the center of the second-lead-terminal-portion end surface 223 and opposite ends thereof in the x direction. The end surface recesses 224 span between opposite ends of the second-lead-terminal-portion end surface 223 in the z direction. The end surface recesses 224 are formed by providing through holes in the lead frame and cutting the lead frame across the through holes in the manufacturing process, as described later.

The connection lead 3 is a plate-shaped conductor that electrically connects the semiconductor element 6 and the second leads 2 to each other. The connection lead 3 is formed by punching or etching a metal plate, for example. The connection lead 3 is made of metal, which is preferably Cu, Al, or an alloy of Cu or Al. The present embodiment describes a case in which the connection lead 3 is made of Cu. The thickness of the connection lead 3 is 0.08 to 0.3 mm, for example, and is about 0.15 mm in the present embodiment.

The connection lead 3 is formed by bending a metal plate, and includes an element connecting portion 31, lead connecting portions 32, a linkage portion 33, and tie bar portions 34.

The element connecting portion 31 is connected to the semiconductor element 6, is substantially parallel to the x-y plane, and has a substantially rectangular shape when viewed in the z direction. The element connecting portion 31 has an element-connecting-portion first surface 311 and an element-connecting-portion second surface 312. The element-connecting-portion first surface 311 and the element-connecting-portion second surface 312 face mutually opposite sides in the z direction. The element-connecting-portion first surface 311 faces downward in FIGS. 3, 5, and 6. The element-connecting-portion first surface 311 is joined to the semiconductor element 6 using solder. As shown in FIG. 6, a plurality of protrusions that extend in the x direction are provided on the element-connecting-portion first surface 311. As a result of solder entering spaces between these protrusions, the element-connecting-portion first surface 311 and the semiconductor element 6 are firmly joined to each other. The element-connecting-portion second surface 312 faces upward in FIGS. 3, 5, and 6.

The lead connecting portions 32 are connected to the second leads 2. In the present embodiment, the semiconductor device A1 includes two second leads 2, and accordingly the connection lead 3 includes two lead connecting portions 32. Each lead connecting portion 32 is substantially parallel to the x-z plane, and has a substantially rectangular shape that is elongated in the z direction when viewed in the y direction. That is, the thickness Y (length in the y direction) of the lead connecting portion 32 is smaller than the length Z thereof in the z direction (see FIG. 8). The lead connecting portion 32 is disposed within the connecting portion recess 24, and is located approximately at the center of the connecting portion 21 of the second lead 2 in the x direction and substantially on the first lead 1 side in the y direction. The lead connecting portion 32 has a lead-connecting-portion first surface 321, a lead-connecting-portion second surface 322, a lead-connecting-portion first side surface 323, a lead-connecting-portion second side surface 324, and a lead-connecting-portion end surface 325.

The lead-connecting-portion first surface 321 and the lead-connecting-portion second surface 322 face mutually opposite sides in the y direction. The lead-connecting-portion first surface 321 faces the upper side in FIGS. 1 and 2, and faces the first lead 1 side in the y direction. The lead-connecting-portion second surface 322 faces the lower side in FIGS. 1 and 2, and faces the first recess side surface 242 of the second lead 2 (see FIG. 8).

The lead-connecting-portion first side surface 323 and the lead-connecting-portion second side surface 324 face mutually opposite sides in the x direction. The lead-connecting-portion first side surface 323 faces left in FIGS. 1 and 2, and faces the second recess side surface 243 of the second lead 2 (see FIG. 9). The lead-connecting-portion second side surface 324 faces right in FIGS. 1 and 2. The lead-connecting-portion first side surface 323 and the lead-connecting-portion second side surface 324 are orthogonal to the lead-connecting-portion first surface 321 and the lead-connecting-portion second surface 322.

The lead-connecting-portion end surface 325 faces the other side (lower side in FIGS. 3, 5, and 6) in the z direction, and faces the recess bottom surface 241 of the second lead 2 (see FIGS. 8 and 9). The lead-connecting-portion end surface 325 is orthogonal to the lead-connecting-portion first surface 321, the lead-connecting-portion second surface 322, the lead-connecting-portion first side surface 323, and the lead-connecting-portion second side surface 324.

As shown in FIGS. 7 to 9, the lead connecting portion 32 is disposed within the connecting portion recess 24 of the second lead 2, and is joined thereto using solder 9.

As shown in FIG. 8, the solder 9 is interposed between the lead-connecting-portion second surface 322 of the lead connecting portion 32 and the first recess side surface 242 of the second lead 2, and a solder fillet 92 is formed spanning from near a boundary between the first recess side surface 242 and the connecting portion main surface 211 of the second lead 2 to the lead-connecting-portion second surface 322. Also, a solder fillet 91 is formed spanning from near a boundary between the recess bottom surface 241 and the connecting portion side surface 213 of the second lead 2 to the lead-connecting-portion first surface 321. A distance L2 from a leading end of the solder fillet 92 on the lead-connecting-portion second surface 322 to the recess bottom surface 241 is significantly longer than a distance L1 from a leading end of the solder fillet 91 on the lead-connecting-portion first surface 321 to the recess bottom surface 241. Also, the area of a second contact region S2 in which the lead-connecting-portion second surface 322 and the solder 9 are in contact with each other is significantly larger than the area of a first contact region S1 in which the lead-connecting-portion first surface 321 and the solder 9 are in contact with each other.

Further, as shown in FIG. 8, a distance W1 between the connecting portion side surface 213 and the lead-connecting-portion first surface 321 in the y direction is short, and is at least not longer than a distance W2 between the first recess side surface 242 and the lead-connecting-portion second surface 322. In the present embodiment, the distance W2 is about 0.1 mm. It is preferable that the distance W2 is not larger than the thickness Y of the lead connecting portion 32 (i.e., the distance between the lead-connecting-portion first surface 321 and the lead-connecting-portion second surface 322) and is at least ⅓Y.

As shown in FIG. 9, the solder 9 is interposed between the lead-connecting-portion first side surface 323 of the lead connecting portion 32 and the second recess side surface 243 of the second lead 2, and a solder fillet 93 is formed spanning from near a boundary between the second recess side surface 243 and the connecting portion main surface 211 of the second lead 2 to the lead-connecting-portion first side surface 323. Also, a solder fillet 94 is formed spanning from the recess bottom surface 241 of the second lead 2 to the lead-connecting-portion second side surface 324. A distance L3 from a leading end of the solder fillet 93 on the lead-connecting-portion first side surface 323 to the recess bottom surface 241 is significantly longer than a distance L4 from a leading end of the solder fillet 94 on the lead-connecting-portion second side surface 324 to the recess bottom surface 241. Also, the area of a third contact region S3 in which the lead-connecting-portion first side surface 323 and the solder 9 are in contact with each other is significantly larger than the area of a fourth contact region S4 in which the lead-connecting-portion second side surface 324 and the solder 9 are in contact with each other.

The linkage portion 33 links the element connecting portion 31 and the two lead connecting portions 32 to each other. One end of the linkage portion 33 in the y direction is continuous to the element connecting portion 31, and the other end of the linkage portion 33 in the y direction is divided into two portions that are respectively continuous to the lead connecting portions 32 (see FIG. 2). The linkage portion 33 has a linkage portion first surface 331 and a linkage portion second surface 332. The linkage portion first surface 331 and the linkage portion second surface 332 face mutually opposite sides in the z direction. The linkage portion first surface 331 faces downward in FIGS. 3, 5, and 6. The linkage portion first surface 331 is continuous to the element-connecting-portion first surface 311 and the lead-connecting-portion first surfaces 321. The linkage portion second surface 332 faces upward in FIGS. 3, 5, and 6. The linkage portion second surface 332 is continuous to the element-connecting-portion second surface 312 and the lead-connecting-portion second surfaces 322.

The tie bar portions 34 are continuous to the linkage portion 33, and are respectively disposed at opposite ends of the linkage portion 33 in the x direction. The tie bar portions 34 are portions that remain after tie bars that connect the connection lead 3 to a lead frame are cut. Each tie bar portion 34 has an end surface that is a cut surface formed by cutting the tie bar.

The semiconductor element 6 exhibits electrical functions of the semiconductor device A1. The type of the semiconductor element 6 is not particularly limited. In the present embodiment, the semiconductor element 6 is a diode. The semiconductor element 6 includes an element main body 60, an element main surface 61, an element back surface 62, a first electrode 63, and a second electrode 64.

As shown in FIG. 6, the element main surface 61 and the element back surface 62 face mutually opposite sides in the z direction. The element main surface 61 faces upward in FIGS. 3, 5, and 6. The element back surface 62 faces downward in FIGS. 3, 5, and 6. The first electrode 63 is disposed on the element back surface 62. The second electrode 64 is disposed on the element main surface 61. In the present embodiment, the first electrode 63 is a cathode electrode, and the second electrode 64 is an anode electrode.

As shown in FIG. 2, the semiconductor element 6 is mounted at the center of the mounting portion main surface 111 in the x and y directions. As shown in FIG. 6, the semiconductor element 6 is mounted on the mounting portion main surface 111 via solder (not shown) with the element back surface 62 facing the mounting portion main surface 111. Thus, the first electrode 63 of the semiconductor element 6 is joined to the mounting portion main surface 111 using solder, and is electrically connected to the first lead 1. Further, as shown in FIG. 6, the element-connecting-portion first surface 311 of the connection lead 3 and the element main surface 61 of the semiconductor element 6 are joined to each other via solder (not shown). Thus, the second electrode 64 of the semiconductor element 6 is joined to the connection lead 3 using solder, and is electrically connected to the second leads 2 via the connection lead 3. The first lead terminal portion 12 that is electrically connected to the first electrode 63 functions as a cathode terminal of the semiconductor device A1, and the second lead terminal portions 22 that are electrically connected to the second electrode 64 function as anode terminals of the semiconductor device A1.

The sealing resin 8 covers respective portions of the first lead 1 and the second leads 2, the connection lead 3, and the semiconductor element 6. The sealing resin 8 is made of a black epoxy resin, for example.

The sealing resin 8 has a resin main surface 81, a resin back surface 82, and resin side surfaces 83. The resin main surface 81 and the resin back surface 82 face mutually opposite sides in the z direction. The resin main surface 81 faces upward in FIGS. 3, 5, and 6, and the resin back surface 82 faces downward in FIGS. 3, 5, and 6. The resin side surfaces 83 connect the resin main surface 81 and the resin back surface 82 to each other, and face the x direction or the y direction. The resin side surfaces 83 include first side surfaces 831 and second side surfaces 832. The second side surfaces 832 are continuous to the resin back surface 82 and are parallel to the x-z plane or the y-z plane. The first side surfaces 831 are continuous to the resin main surface 81 and are inclined relative to the x-z plane or the y-z plane.

In the present embodiment, the first lead terminal portion 12, the tie bar portions 14, and the second lead terminal portions 22 protrude from the second side surfaces 832 of the resin side surfaces 83, and the first-lead-terminal-portion end surface 123, the end surface recesses 124, the second-lead-terminal-portion end surfaces 223, and the end surface recesses 224 are exposed from the second side surfaces 832 of the resin side surfaces 83. The mounting portion back surface 112 and the first-lead-terminal-portion back surface 122 of the first lead 1 and the connecting portion back surfaces 212 and the second-lead-terminal-portion back surfaces 222 of the second leads 2 are flush with the resin back surface 82 of the sealing resin 8. The two second leads 2 are disposed along a surface that faces the other side (lower side in FIG. 2) in the y direction, out of the resin side surfaces 83.

Next, one example of the manufacturing method of the semiconductor device A1 will be described with reference to FIGS. 10 to 14. Note that these figures are plan views, and the x direction, the y direction, and the z direction in these figures are the same as those in FIG. 2.

Figure 10:
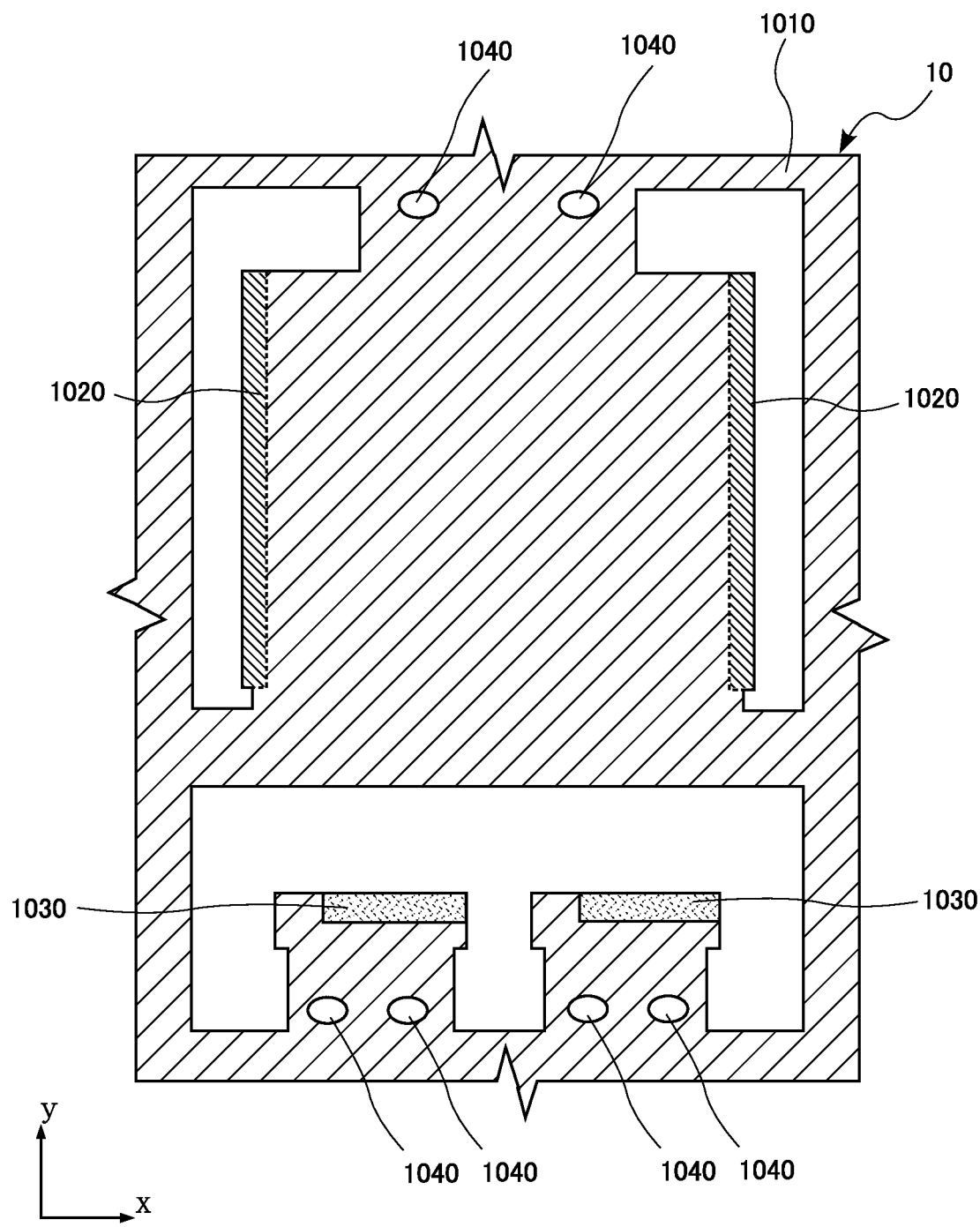
FIG. 10 is a plan view showing a manufacturing process of the semiconductor device shown in FIG. 1.

First, a lead frame 10 is prepared as shown in FIG. 10. The lead frame 10 is a plate-shaped material that constitutes the first lead 1 and the second leads 2. Note that FIG. 10 only shows regions that constitute one first lead 1 and two second leads 2 (the same also applies to FIGS. 13 and 14). The lead frame 10 is formed by etching a metal plate. Note that the lead frame 10 may also be formed by punching a metal plate.

The lead frame 10 has a main surface 1010 that constitutes the mounting portion main surface 111, the first-lead-terminal-portion main surface 121, the thin portion main surfaces 131, the connecting portion main surfaces 211, and the second-lead-terminal-portion main surfaces 221. Relatively coarsely hatched regions in the drawing have a large thickness (length in the z direction), and include regions that constitute the mounting portion 11, the first lead terminal portion 12, the connecting portions 21, and the second lead terminal portions 22. Relatively densely hatched regions in the drawing have a small thickness (length in the z direction), and are regions 1020 that constitute the thin portions 13. These regions 1020 are formed through half-etching in which only a back surface that faces the side opposite to the main surface 1010 is etched. Dotted regions 1030 in the drawing have a small thickness (length in the z direction), and constitute the connecting portion recesses 24. These regions 1030 are formed through half-etching in which only the main surface 1010 is etched. Note that the regions 1020 and 1030 may also be formed through pressing.

Through holes 1040 for forming the end surface recesses 124 and 224 are formed in regions that constitute the first lead terminal portion 12 and the second lead terminal portions 22. In the present embodiment, the base material of the lead frame 10 is made of Cu.

Figure 11:
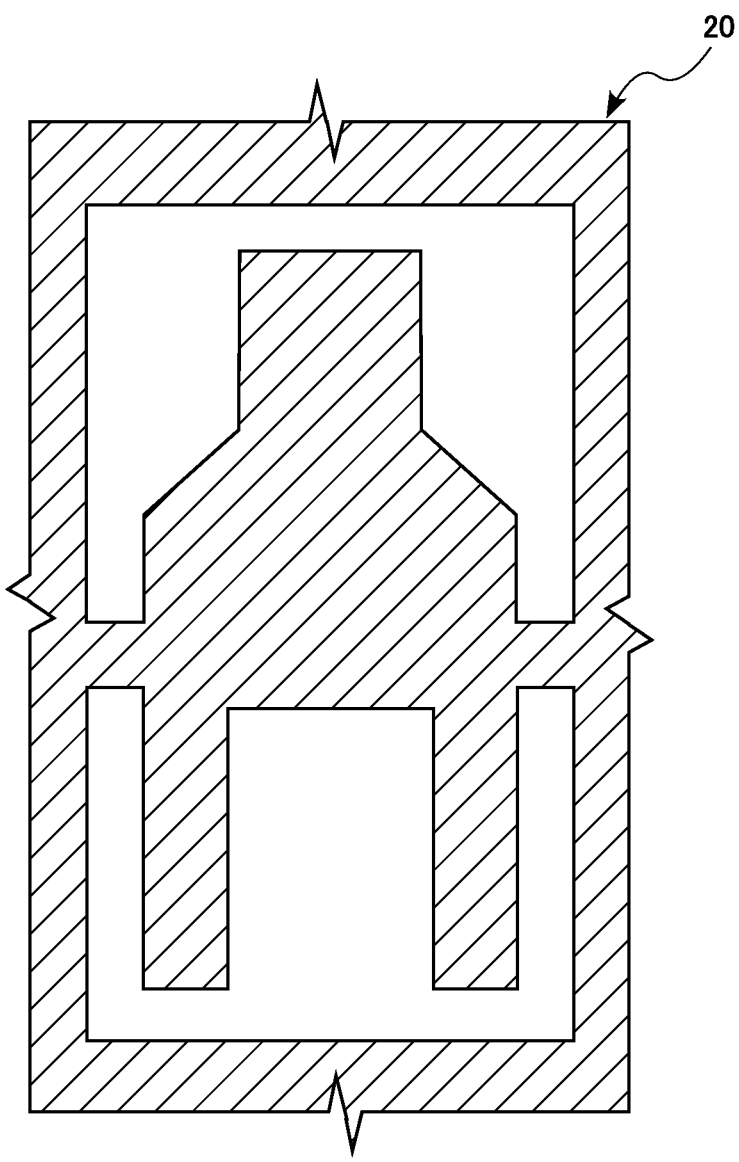
FIG. 11 is a plan view showing a manufacturing process of the semiconductor device shown in FIG. 1.
Figure 12:
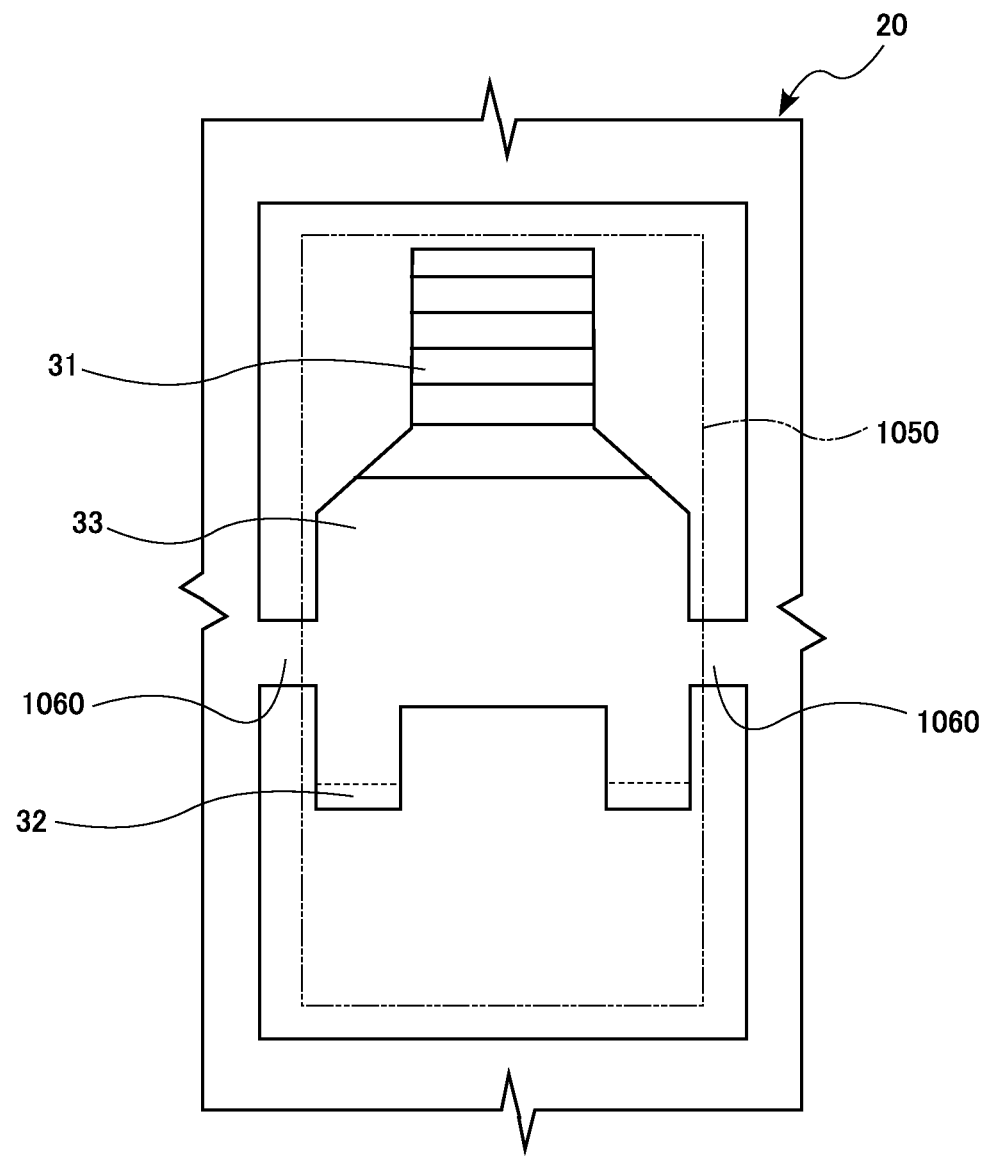
FIG. 12 is a plan view showing a manufacturing process of the semiconductor device shown in FIG. 1.

Further, separately from the lead frame 10, a lead frame 20 is prepared as shown in FIG. 11. In FIG. 11, the lead frame 20 is hatched. The lead frame 20 is a plate-shaped material that constitutes the connection lead 3. Note that FIG. 11 only shows a region that constitutes one connection lead 3 (the same also applies to FIG. 12). The lead frame 20 is formed by etching a metal plate. Note that the lead frame 20 may also be formed by punching a metal plate. In the present embodiment, the base material of the lead frame 20 is made of Cu. Then, the lead frame 20 is bent to form the element connecting portion 31, the lead connecting portions 32, and the linkage portion 33 as shown in FIG. 12. Then, the lead frame 20 is cut along a cutting line 1050 (indicated by a line-double-dash line in FIG. 12) to obtain the connection lead 3. As a result of tie bars 1060 being cut along the cutting line 1050, the tie bar portions 34 having end surfaces, which are cut surfaces, are formed.

Figure 13:
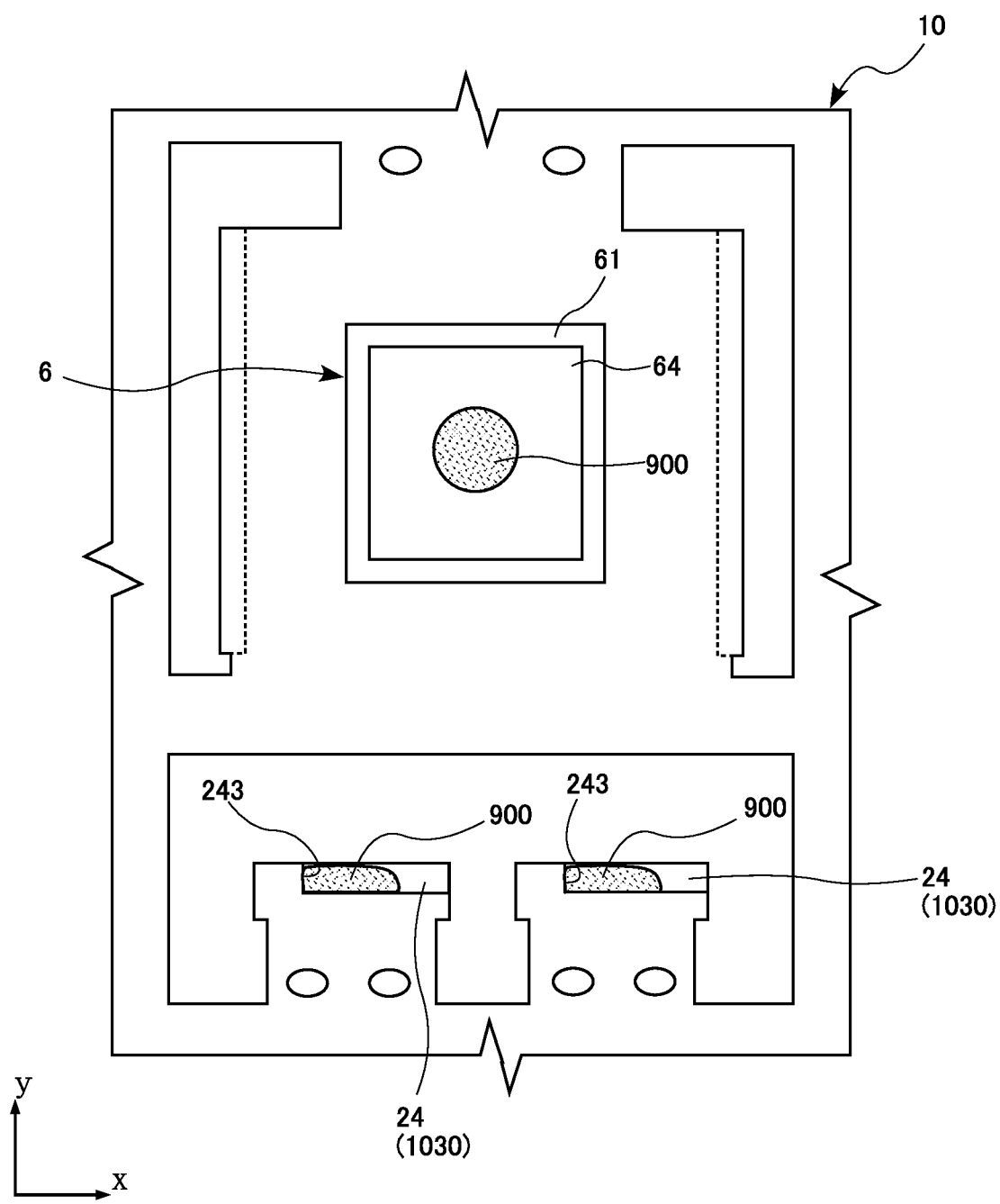
FIG. 13 is a plan view showing a manufacturing process of the semiconductor device shown in FIG. 1.

Then, solder paste is applied to the center of a region of the main surface 1010 of the lead frame 10 that constitutes the mounting portion main surface 111 of the first lead 1, and the semiconductor element 6 is bonded to the region. Then, as shown in FIG. 13, solder paste 900 is applied to the second electrode 64 on the element main surface 61 of the semiconductor device 6. The solder paste 900 is also applied to the inside of the connecting portion recesses 24 (regions 1030) of the second leads 2. At this time, the solder paste 900 is applied close to the second recess side surfaces 243.

Figure 14:
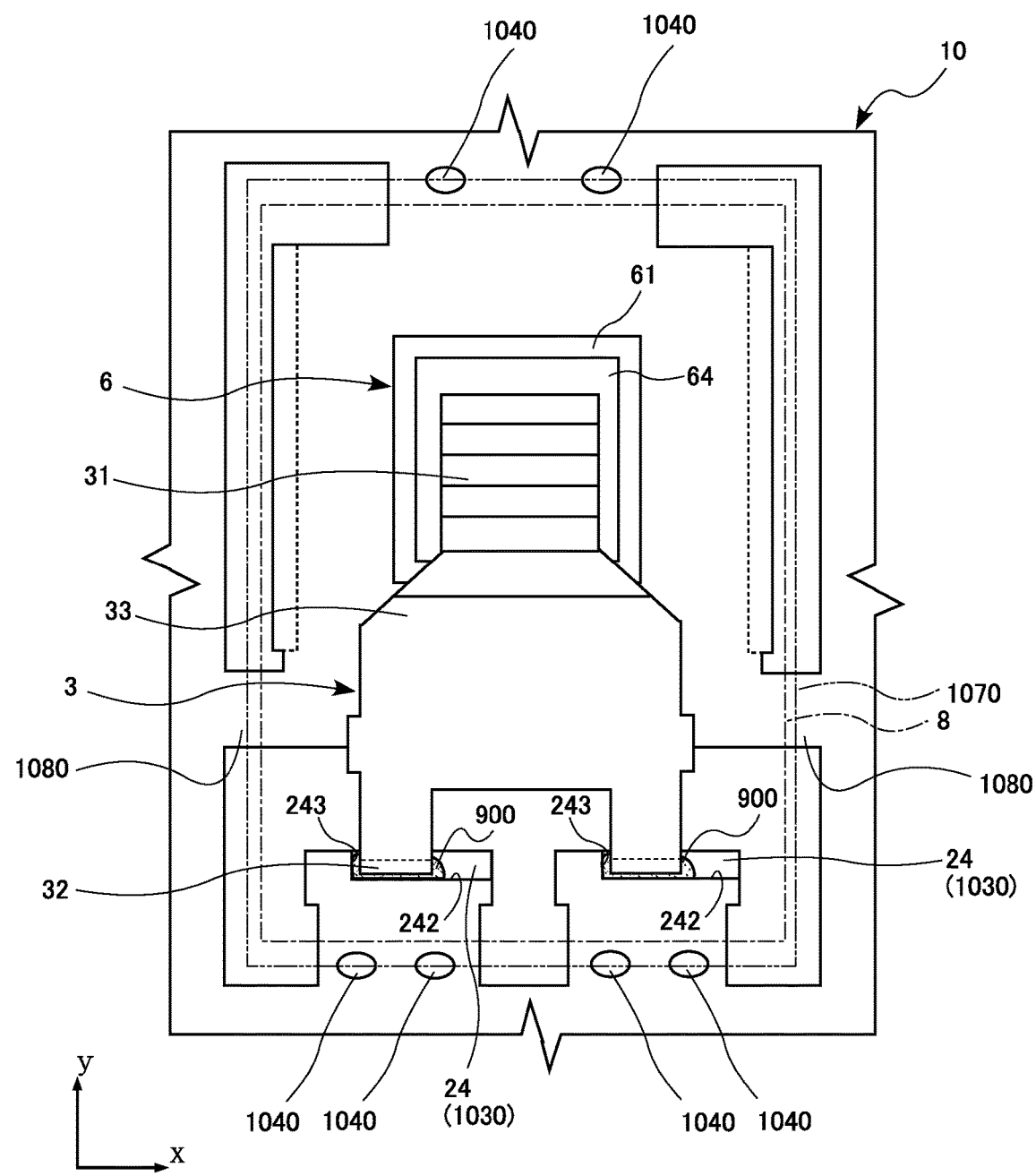
FIG. 14 is a plan view showing a manufacturing process of the semiconductor device shown in FIG. 1.

Then, as shown in FIG. 14, the connection lead 3 is bonded to the second electrode 64 of the semiconductor element 6 and the connecting portion recesses 24. The element connecting portion 31 of the connection lead 3 is bonded to the second electrode 64 of the semiconductor element 6, and the lead connecting portions 32 of the connection lead 3 are bonded to the connecting portion recesses 24. Then, a reflow process is performed. The solder paste 900 melts in the reflow process, and the molten solder joins the element connecting portion 31 and the second electrode 64 to each other and joins the lead connecting portions 32 and the connecting portion recesses 24 to each other. At this time, the lead connecting portions 32 are drawn toward the first recess side surfaces 242 and the second recess side surfaces 243 by the surface tension of the molten solder. Thus, the connection lead 3 is positioned.

Then, the sealing resin 8 (indicated by a line-dash line in FIG. 14) that covers the semiconductor element 6, the connection lead 3, and portions of the lead frame 10 is formed by curing a resin material. Then, the lead frame 10 is cut along a cutting line 1070 (indicated by a line-double-dash line in FIG. 14). At this time, as a result of the lead frame 10 being cut along the cutting line 1070 that crosses the through holes 1040, the first-lead-terminal-portion end surface 123 and the second-lead-terminal-portion end surfaces 223, which are cut surfaces, and the end surface recesses 124 and 224, which formed inner walls of the through holes 1040, are formed. Also, as a result of tie bars 1080 being cut along the cutting line 1070, the tie bar portions 14 having the end surfaces 143, which are cut surfaces, are formed.

Through the above process, the above-described semiconductor device A1 is obtained.

Next, functions and effects of the semiconductor device A1 will be described.

According to the present embodiment, the lead connecting portions 32 of the connection lead 3 are joined to the connecting portions 21 within the connecting portion recesses 24 of the second leads 2. In the reflow process, each lead connecting portion 32 is drawn toward the first recess side surface 242 by the surface tension of molten solder interposed between the lead-connecting-portion second surface 322 and the first recess side surface 242. At this time, the lead-connecting-portion second surface 322 becomes substantially parallel to the first recess side surface 242. Therefore, the orientation of the connection lead 3 when viewed in the z direction can be kept from deviating from a predetermined orientation. Furthermore, the distance between the lead-connecting-portion second surface 322 and the first recess side surface 242 can be made constant by adjusting the amount of the solder paste 900 applied to the connecting portion recess 24. Therefore, the position of the connection lead 3 in the y direction can be kept from being displaced from a predetermined position.

Also, in the reflow process, each lead connecting portion 32 is drawn toward the second recess side surface 243 by the surface tension of molten solder interposed between the lead-connecting-portion first side surface 323 and the second recess side surface 243. At this time, the lead-connecting-portion first side surface 323 becomes substantially parallel to the second recess side surface 243. Therefore, the orientation of the connection lead 3 when viewed in the z direction can be kept from deviating from a predetermined orientation. Furthermore, the distance between the lead-connecting-portion first side surface 323 and the second recess side surface 243 can be made constant by adjusting the amount of the solder paste 900 applied to the connecting portion recess 24. Therefore, the position of the connection lead 3 in the x direction can be kept from being displaced from a predetermined position.

Furthermore, according to the present embodiment, the distance W1 between the connecting portion side surface 213 and the lead-connecting-portion first surface 321 in the y direction is short, when compared to the distance W2 between the first recess side surface 242 and the lead-connecting-portion second surface 322. Accordingly, the solder fillet 91 formed on the lead-connecting-portion first surface 321 is small, when compared to the solder fillet 92 formed on the lead-connecting-portion second surface 322. Also, the area of the second contact region S2 in which the lead-connecting-portion second surface 322 and the solder 9 are in contact with each other is significantly large, when compared to the area of the first contact region S1 in which the lead-connecting-portion first surface 321 and the solder 9 are in contact with each other. These facts mean that, in the reflow process, the amount of molten solder located on the lead-connecting-portion second surface 322 side is significantly larger than the amount of molten solder located on the lead-connecting-portion first surface 321 side. Therefore, the surface tension of the solder located on the lead-connecting-portion first surface 321 side is significantly small, when compared to the surface tension of the solder located on the lead-connecting-portion second surface 322 side, and is unlikely to affect the position of the lead connecting portion 32 in the y direction.

Furthermore, according to the present embodiment, the solder paste 900 is applied close to the second recess side surface 243 in the process of applying the solder paste in the manufacturing process. Accordingly, the area of the third contact region S3 in which the lead-connecting-portion first side surface 323 and the solder 9 are in contact with each other is significantly large, when compared to the area of the fourth contact region S4 in which the lead-connecting-portion second side surface 324 and the solder 9 are in contact with each other. Also, the solder fillet 94 formed on the lead-connecting-portion second side surface 324 is small, when compared to the solder fillet 93 formed on the lead-connecting-portion first side surface 323. In the reflow process, the amount of molten solder located on the lead-connecting-portion first side surface 323 side is significantly larger than the amount of molten solder located on the lead-connecting-portion second side surface 324 side, and therefore the surface tension of the solder located on the lead-connecting-portion second side surface 324 side is significantly small, when compared to the surface tension of the solder located on the lead-connecting-portion first side surface 323 side, and is unlikely to affect the position of the lead connecting portion 32 in the x direction.

Furthermore, according to the present embodiment, the semiconductor device A1 includes two second leads 2. The connection lead 3 includes two lead connecting portions 32 continuous to the linkage portion 33. The lead connecting portions 32 are respectively joined to the second leads 2. Therefore, displacement of the connection lead 3 can be further suppressed, when compared to a case in which only one second lead 2 and only one lead connecting portion 32 are provided.

Figure 15:
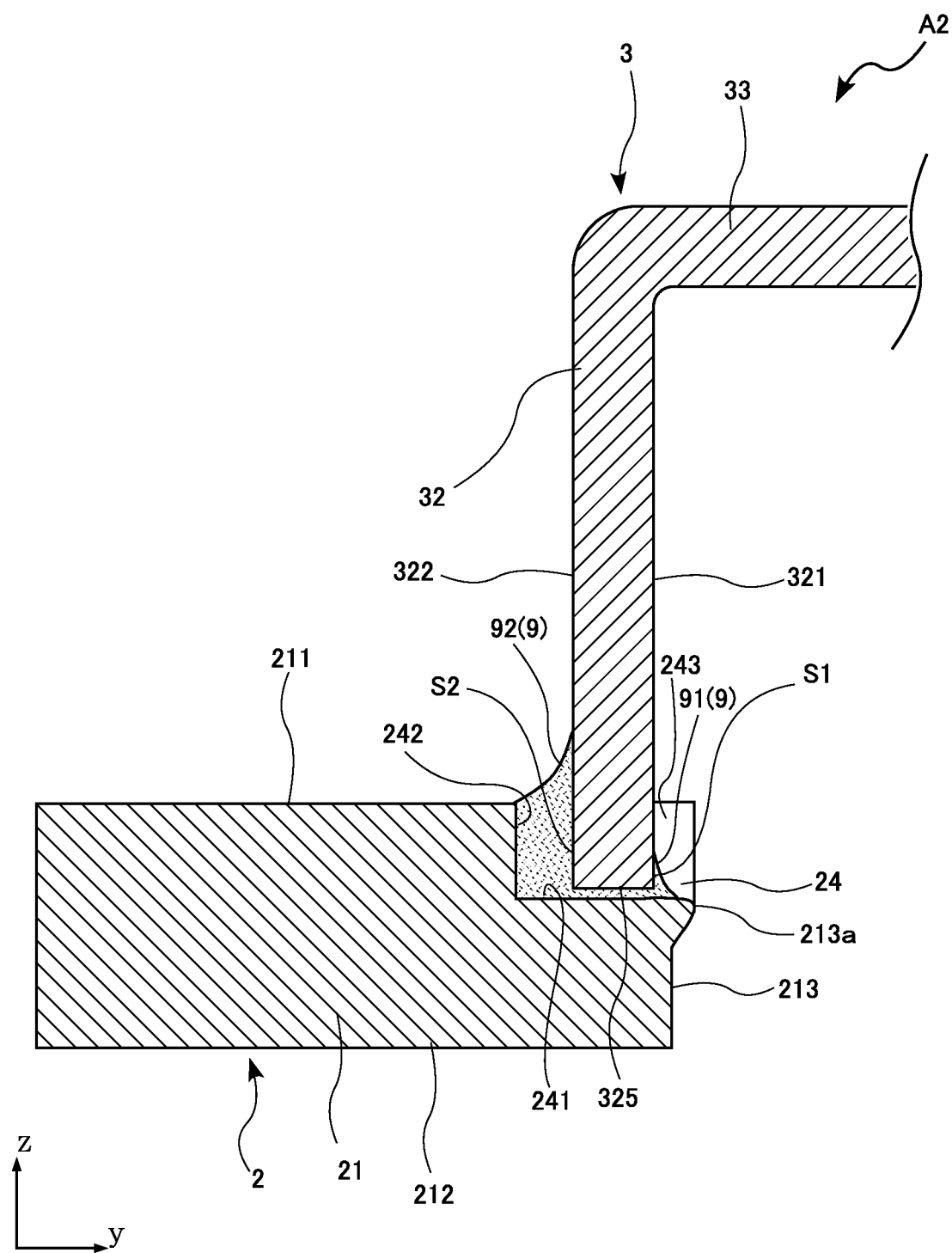
FIG. 15 is an enlarged cross-sectional view showing a main portion of a semiconductor device according to a second embodiment of the present disclosure.

A semiconductor device A2 according to a second embodiment of the present disclosure will be described based on FIG. 15. In FIG. 15, elements that are the same as or are similar to those in the above-described semiconductor device A1 are denoted with the same reference numerals as those used for corresponding elements in the semiconductor device A1, and a redundant description thereof is omitted. FIG. 15 is an enlarged cross-sectional view showing a main portion of the semiconductor device A2, and corresponds to FIG. 8 showing the semiconductor device A1 according to the first embodiment.

The semiconductor device A2 according to the present embodiment differs from the semiconductor device A1 in the method for forming the connecting portion recesses 24 of the second leads 2. The connecting portion recesses 24 according to the present embodiment are formed through pressing, rather than half-etching. The connecting portion side surface 213 includes a protruding portion 213a. The protruding portion 213a bulges and protrudes toward one side (right side in FIG. 15) in the y direction due to plastic deformation that occurs in the pressing, is formed at an end portion of the connecting portion side surface 213 on the connecting portion recess 24 side, and extends in the x direction.

In the present embodiment, the configurations of the second leads 2 and the connection lead 3 are similar to those in the first embodiment, and therefore effects similar to those achieved in the first embodiment can be achieved.

Figure 16:
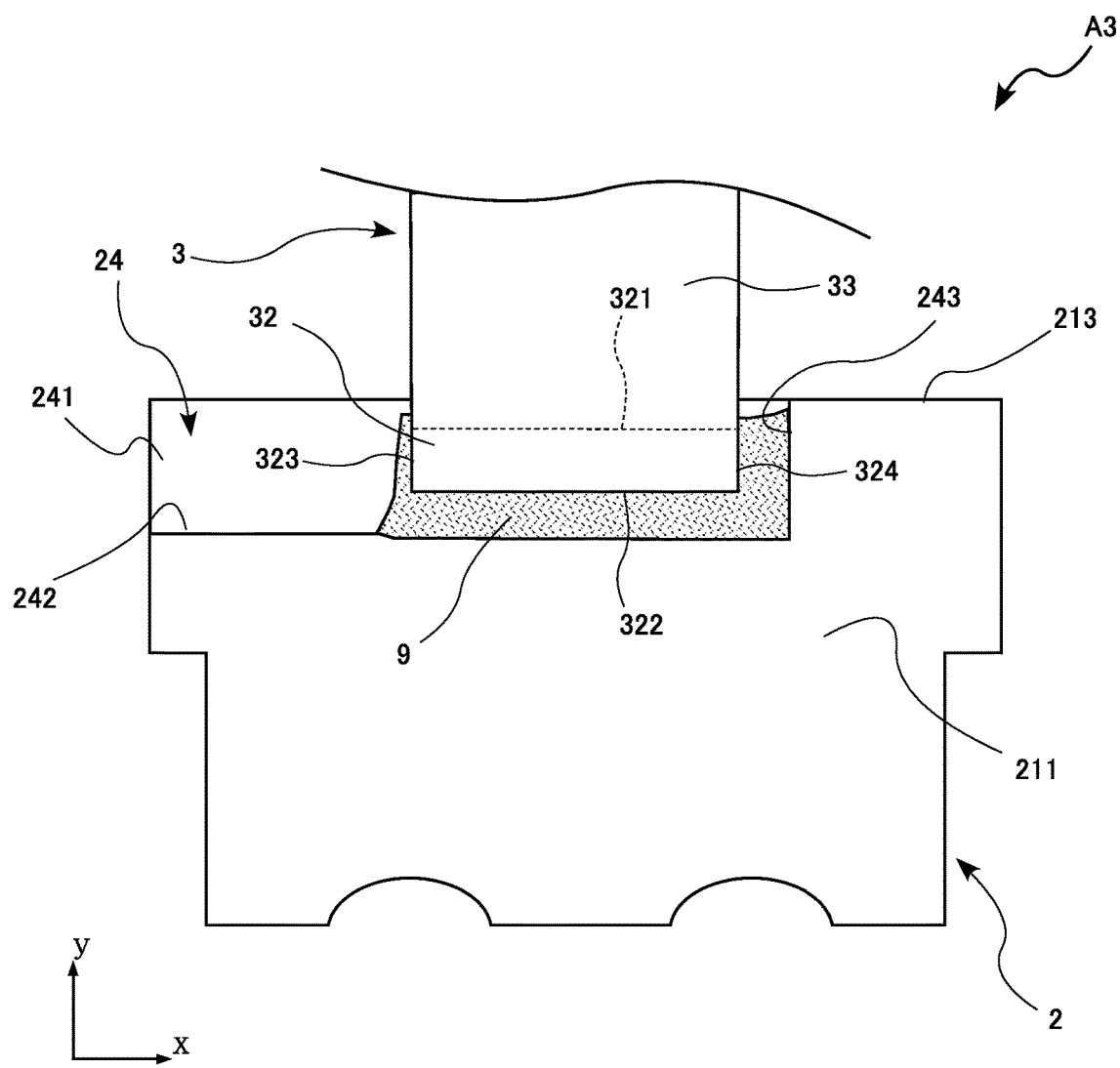
FIG. 16 is an enlarged plan view showing a main portion of a semiconductor device according to a third embodiment of the present disclosure.

A semiconductor device A3 according to a third embodiment of the present disclosure will be described based on FIG. 16. In FIG. 16, elements that are the same as or are similar to those in the above-described semiconductor device A1 are denoted with the same reference numerals as those used for corresponding elements in the semiconductor device A1, and a redundant description thereof is omitted. FIG. 16 is an enlarged plan view showing a main portion of the semiconductor device A3, and corresponds to FIG. 7 showing the semiconductor device A1 according to the first embodiment.

The semiconductor device A3 according to the present embodiment differs from the semiconductor device A1 in the arrangement positions and the shape of the connecting portion recesses 24. Each connecting portion recess 24 according to the present embodiment is disposed in the end portion (upper end portion in FIG. 16) of the connecting portion main surface 211 on the first lead 1 side in the y direction and in the other end portion (left end portion in FIG. 16) of the connecting portion main surface 211 in the x direction. Each connecting portion recess 24 is open on the first lead 1 side (upper side in FIG. 16) in the y direction and on the other side (left side in FIG. 16) in the x direction. The second recess side surface 243 faces the other side (left side in FIG. 16) in the x direction, and faces the lead-connecting-portion second side surface 324 of the connection lead 3.

In the present embodiment as well, in the reflow process, the surface tension of molten solder interposed between the lead-connecting-portion second surface 322 and the first recess side surface 242 acts, and the surface tension of molten solder located on the lead-connecting-portion first surface 321 side does not act much, as is the case with the first embodiment. Also, in the reflow process, the surface tension of molten solder interposed between the lead-connecting-portion second side surface 324 and the second recess side surface 243 acts, and the surface tension of molten solder located on the lead-connecting-portion first side surface 323 side does not act much. Therefore, effects similar to those achieved in the first embodiment can be achieved.

Figure 17:
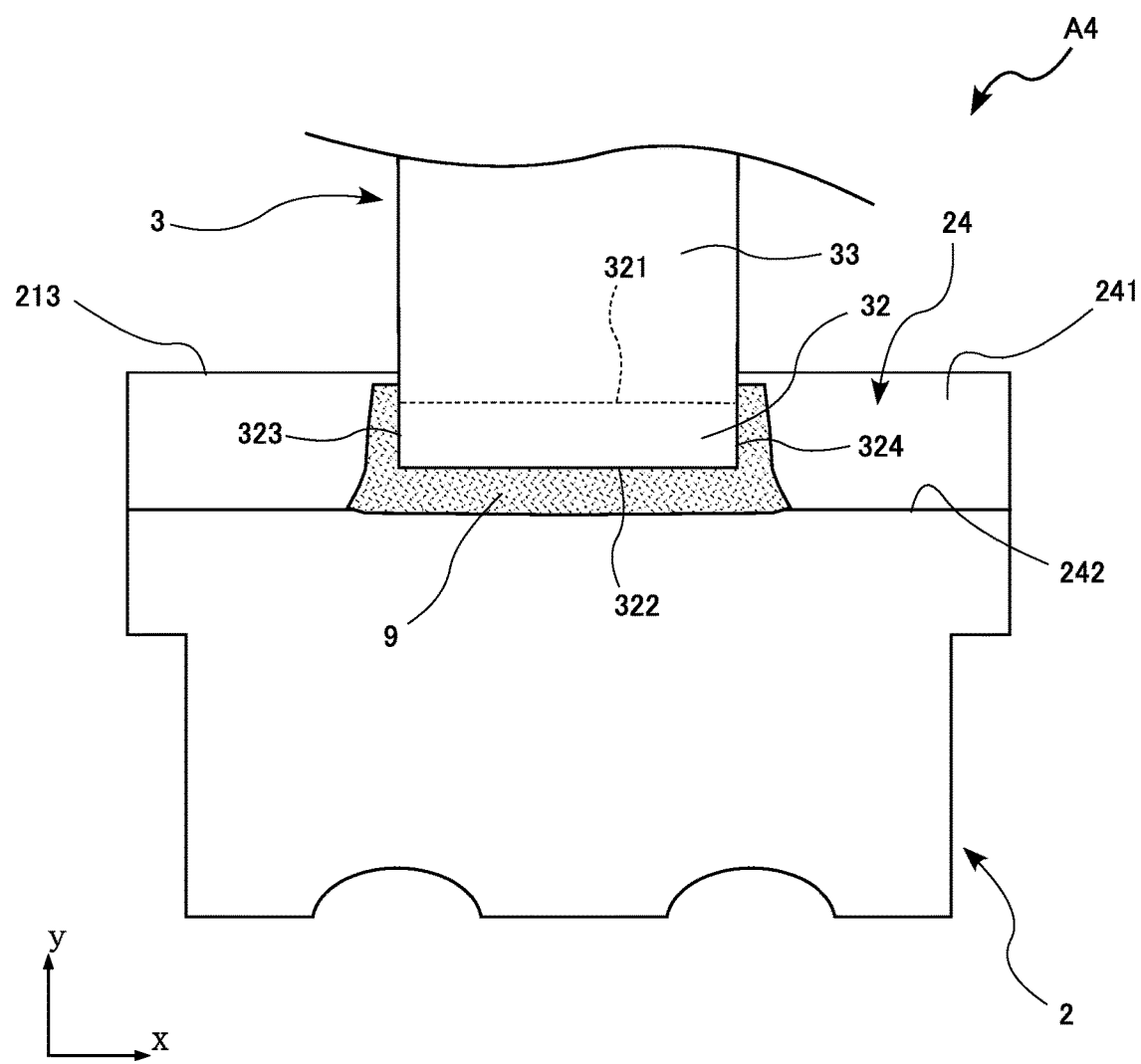
FIG. 17 is an enlarged plan view showing a main portion of a semiconductor device according to a fourth embodiment of the present disclosure.

A semiconductor device A4 according to a fourth embodiment of the present disclosure will be described based on FIG. 17. In FIG. 17, elements that are the same as or are similar to those in the above-described semiconductor device A1 are denoted with the same reference numerals as those used for corresponding elements in the semiconductor device A1, and a redundant description thereof is omitted. FIG. 17 is an enlarged plan view showing a main portion of the semiconductor device A4, and corresponds to FIG. 7 showing the semiconductor device A1 according to the first embodiment.

The semiconductor device A4 according to the present embodiment differs from the semiconductor device A1 in the arrangement positions and the shape of the connecting portion recesses 24. Each connecting portion recess 24 according to the present embodiment is disposed in the end portion (upper end portion in FIG. 17) of the connecting portion main surface 211 on the first lead 1 side in the y direction, and spans between opposite ends of the connecting portion main surface 211 in the x direction. Each connecting portion recess 24 is open on the first lead 1 side (upper side in FIG. 17) in the y direction and on both sides in the x direction. Each connecting portion recess 24 does not have a surface that corresponds to the second recess side surface 243 in the first embodiment.

In the present embodiment as well, in the reflow process, the surface tension of molten solder interposed between the lead-connecting-portion second surface 322 and the first recess side surface 242 acts, and the surface tension of molten solder located on the lead-connecting-portion first surface 321 side does not act much, as is the case with the first embodiment. Therefore, the orientation of the connection lead 3 when viewed in the z direction can be kept from deviating from a predetermined orientation. Also, the position of the connection lead 3 in the y direction can be kept from being displaced from a predetermined position. Note that the position of the connection lead 3 in the x direction can be adjusted to some extent so as to match a predetermined position by adjusting the position in the connecting portion recess 24 to which the solder paste 900 is applied. However, in order to further suppress displacement of the connection lead 3 in the x direction, it is desirable that the connecting portion recess 24 has the second recess side surface 243 as is the case with the first to third embodiments.

Figure 18:
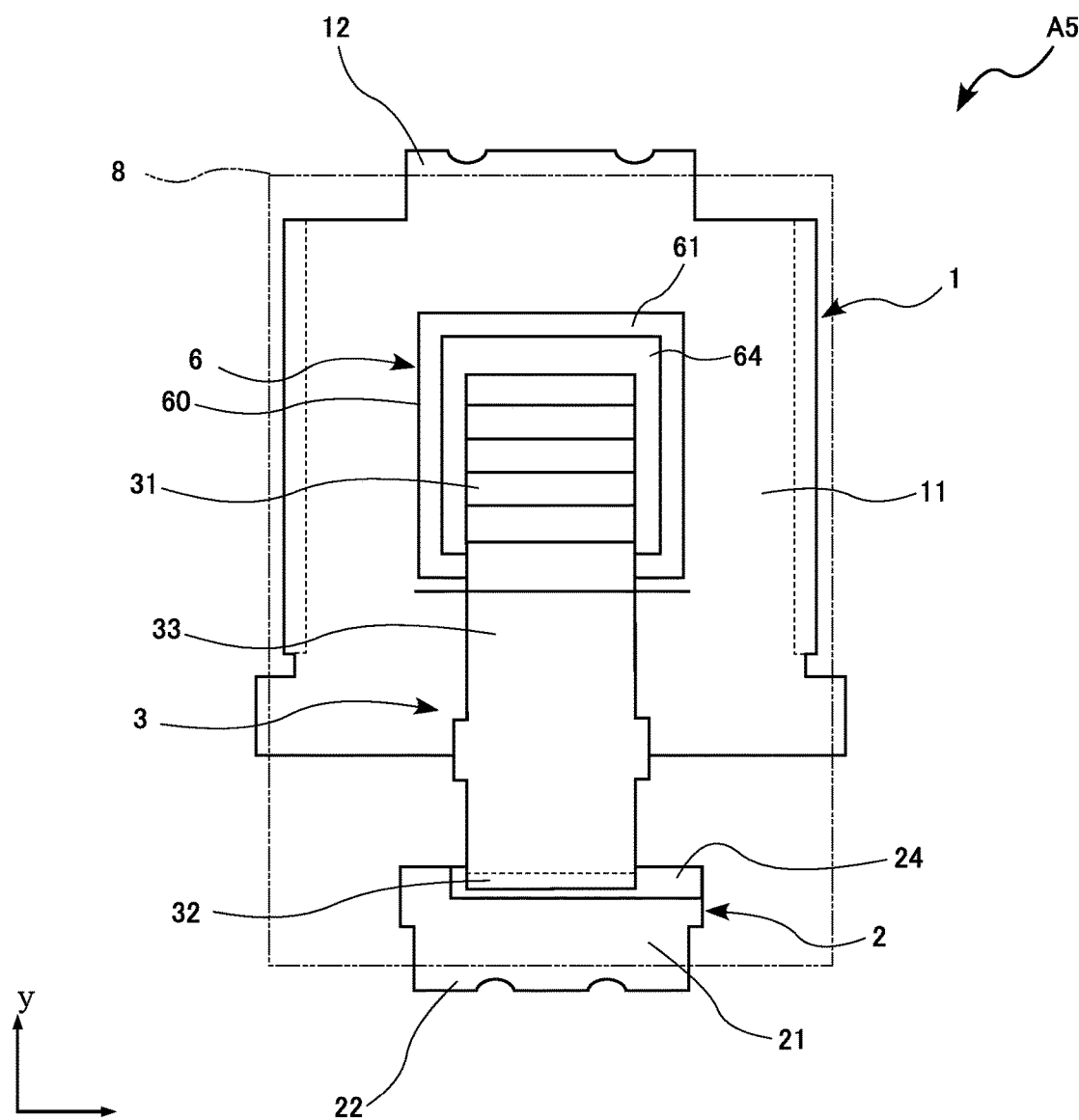
FIG. 18 is a plan view showing the inside of a semiconductor device according to a fifth embodiment of the present disclosure in a transparent view.

A semiconductor device A5 according to a fifth embodiment of the present disclosure will be described based on FIG. 18. In FIG. 18, elements that are the same as or are similar to those in the above-described semiconductor device A1 are denoted with the same reference numerals as those used for corresponding elements in the semiconductor device A1, and a redundant description thereof is omitted. FIG. 18 is a plan view showing the inside of the semiconductor device A5 in a transparent view, and corresponds to FIG. 2 showing the semiconductor device A1 according to the first embodiment.

The semiconductor device A5 according to the present embodiment differs from the semiconductor device A1 in the number of second leads 2 included in the semiconductor device. The semiconductor device A5 includes only one second lead 2. The connection lead 3 includes only one lead connecting portion 32 in correspondence with the number of second leads 2.

In the present embodiment, the configurations of the connecting portion recess 24 of the second lead 2 and the lead connecting portion 32 of the connection lead 3 are similar to those in the first embodiment, and therefore effects similar to those achieved in the first embodiment can be achieved. Note that the number of second leads 2 is not limited, and may be three or more.

Figure 19:
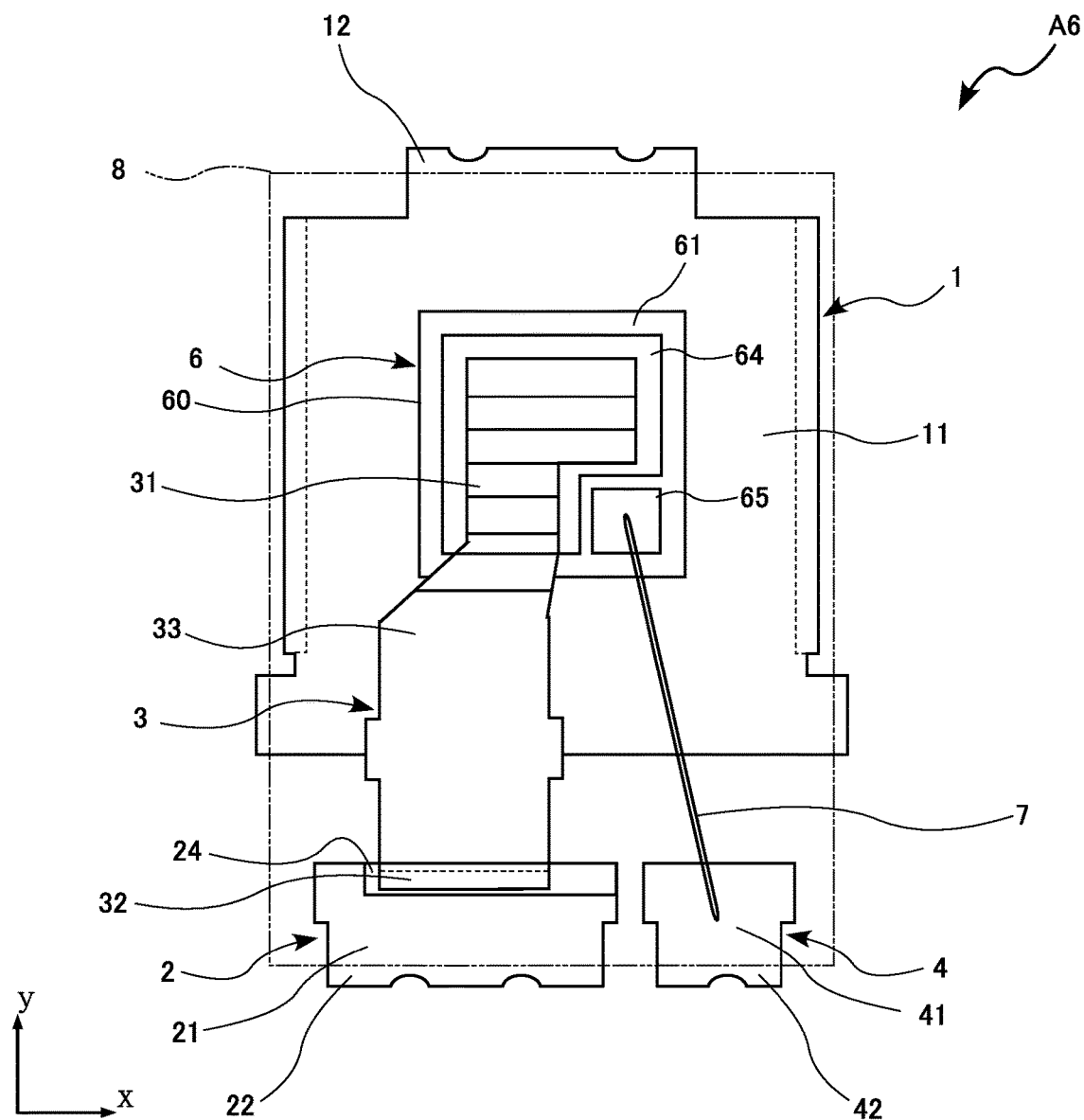
FIG. 19 is a plan view showing the inside of a semiconductor device according to a sixth embodiment of the present disclosure in a transparent view.

A semiconductor device A6 according to a sixth embodiment of the present disclosure will be described based on FIG. 19. In FIG. 19, elements that are the same as or are similar to those in the above-described semiconductor device A1 are denoted with the same reference numerals as those used for corresponding elements in the semiconductor device A1, and a redundant description thereof is omitted. FIG. 19 is a plan view showing the inside of the semiconductor device A6 in a transparent view, and corresponds to FIG. 2 showing the semiconductor device A1 according to the first embodiment.

The semiconductor device A6 according to the present embodiment differs from the semiconductor device A1 in the configuration of the semiconductor element 6. In the present embodiment, the semiconductor element 6 is a transistor, such as a MOSFET (Metal-Oxide-Semiconductor Field-Effect Transistor), and further includes a third electrode 65 that is disposed on the element main surface 61. The semiconductor device A6 includes only one second lead 2, and further includes a third lead 4. The connection lead 3 includes only one lead connecting portion 32 in correspondence with the number of second leads 2, and the lead connecting portion 32 is joined to the second lead 2. The third lead 4 includes a connecting portion 41 and a third lead terminal portion 42. The connecting portion 41 is similar to the connecting portion 21, but does not include the connecting portion recess 24. The third lead terminal portion 42 is similar to the second lead terminal portion 22. One end of a bonding wire 7 is joined to the third electrode 65, and the other end of the bonding wire 7 is joined to the connecting portion 41 of the third lead 4. Thus, the third electrode 65 and the third lead 4 are electrically connected to each other. In order to facilitate joining of the bonding wire 7, a plating layer made of Ag or the like may also be formed on the surface of the third lead 4.

In the present embodiment, the configurations of the connecting portion recess 24 of the second lead 2 and the lead connecting portion 32 of the connection lead 3 are similar to those in the first embodiment, and therefore effects similar to those achieved in the first embodiment can be achieved. Furthermore, the semiconductor device A6 according to the present embodiment is applicable to a case in which two types of electrode are disposed on the element main surface 61 of the semiconductor element 6.

Figure 20:
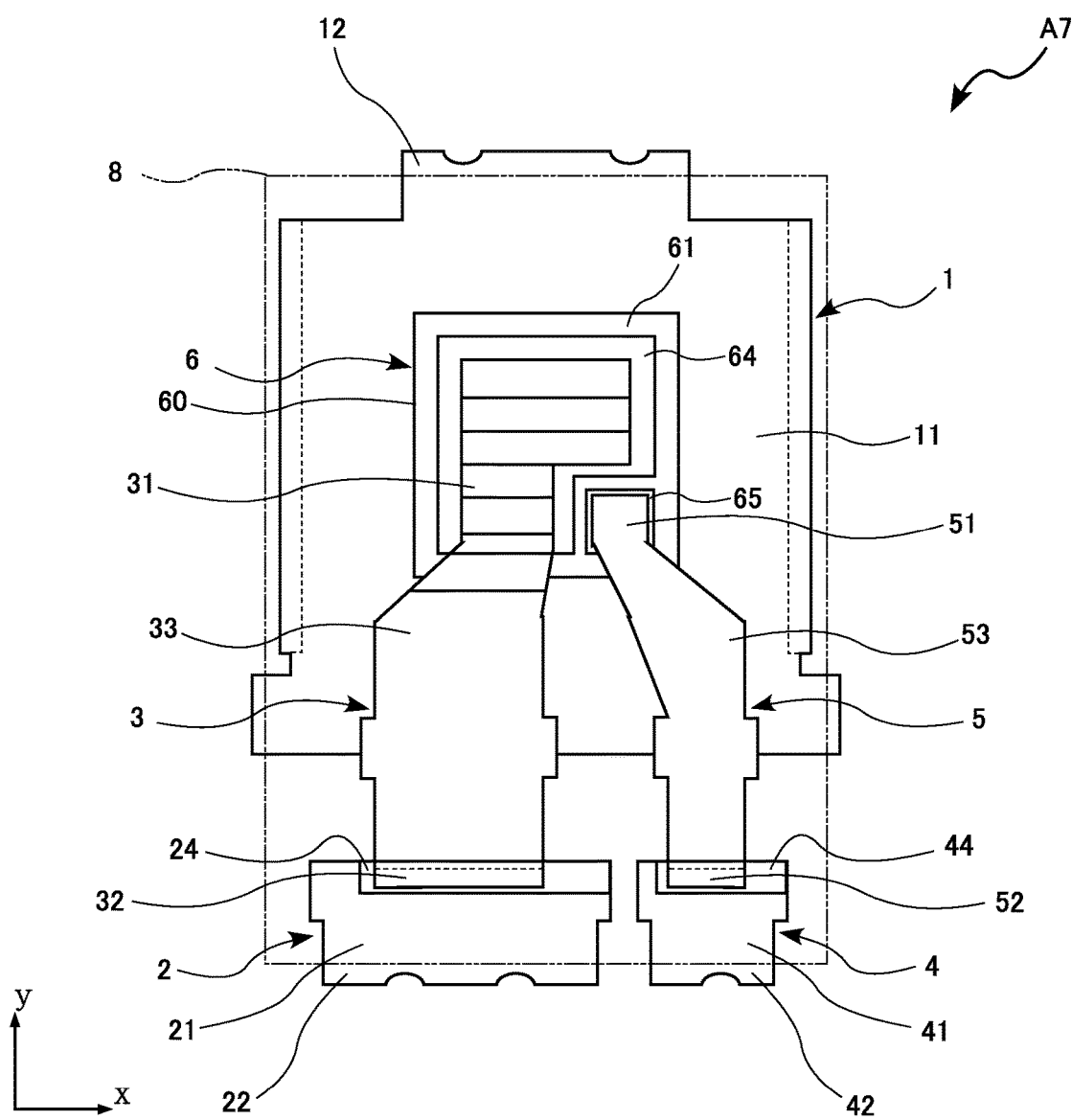
FIG. 20 is a plan view showing the inside of a semiconductor device according to a seventh embodiment of the present disclosure in a transparent view.

A semiconductor device A7 according to a seventh embodiment of the present disclosure will be described based on FIG. 20. In FIG. 20, elements that are the same as or are similar to those in the above-described semiconductor device A6 are denoted with the same reference numerals as those used for corresponding elements in the semiconductor device A6, and a redundant description thereof is omitted. FIG. 20 is a plan view showing the inside of the semiconductor device A7 in a transparent view, and corresponds to FIG. 19 showing the semiconductor device A6 according to the sixth embodiment.

The semiconductor device A7 according to the present embodiment differs from the semiconductor device A6 in the method for connecting the third electrode 65 to the third lead 4. In the present embodiment, the third electrode 65 and the third lead 4 are connected to each other via a connection lead 5, rather than the bonding wire 7. The connecting portion 41 of the third lead 4 according to the present embodiment includes a connecting portion recess 44 that is similar to the connecting portion recess 24 of the second lead 2. The semiconductor device A7 further includes the connection lead 5. The connection lead 5 is similar to the connection lead 3, and includes an element connecting portion 51, a lead connecting portion 52, and a linkage portion 53. The element connecting portion 51 is similar to the element connecting portion 31, and is connected to the third electrode 65 of the semiconductor element 6. The lead connecting portion 52 is similar to the lead connecting portion 32, and is connected to the third lead 4. The linkage portion 53 is similar to the linkage portion 33, and links the element connecting portion 51 and the lead connecting portion 52 to each other. The connection lead 5 corresponds to a "second connection lead" in the present disclosure.

In the present embodiment, the configurations of the second lead 2 and the connection lead 3 are similar to those in the sixth embodiment, and the third electrode 65 is connected to the third lead 4, and therefore effects similar to those achieved in the sixth embodiment can be achieved. Furthermore, according to the present embodiment, the third electrode 65 and the third lead 4 are connected to each other via the connection lead 5. The configuration of the connecting portion recess 44 of the third lead 4 is similar to the configuration of the connecting portion recess 24 of the second lead 2, and the configuration of the lead connecting portion 52 of the connection lead 5 is similar to the configuration of the lead connecting portion 32 of the connection lead 3. Therefore, displacement of the connection lead 5 can be suppressed in the present embodiment. Furthermore, unlike the sixth embodiment, a process for connecting the second electrode 64 to the second lead 2 and a process for connecting the third electrode 65 to the third lead 4 can be performed using the same process.

A semiconductor device according to the present disclosure is not limited to the above-described embodiments. Various design changes can be made on specific configurations of the portions of the semiconductor device according to the present disclosure.

The invention claimed is:

1. A semiconductor device comprising:
   a semiconductor element that includes: an element main surface and an element back surface that face mutually opposite sides in a thickness direction; a first electrode that is disposed on the element back surface; and a second electrode that is disposed on the element main surface;
   a first lead to which the first electrode of the semiconductor element is joined;
   at least one second lead that is electrically connected to the second electrode; and
   a connection lead including an element connecting portion joined to the second electrode and a lead connecting portion joined to the second lead by solder,
   wherein the lead connecting portion includes: a lead-connecting-portion first surface that faces the semiconductor element in a first direction orthogonal to the thickness direction; a lead-connecting-portion second surface that faces opposite to the lead-connecting-portion first surface; and a lead-connecting-portion end surface that is connected to the lead-connecting-portion first surface and the lead-connecting-portion second surface and faces the element back surface in the thickness direction,
   the second lead includes a connecting portion recess that includes a first recess side surface facing the lead-connecting-portion second surface and a recess bottom surface facing the lead-connecting-portion end surface, the connecting portion recess being open toward the semiconductor element in the first direction, and
   an area of a second contact region in which the lead-connecting-portion second surface and solder are in contact with each other is larger than an area of a first contact region in which the lead-connecting-portion first surface and solder are in contact with each other.

2. The semiconductor device according to claim 1, wherein the connecting portion recess includes a second recess side surface that intersects the first recess side surface and the recess bottom surface.

3. The semiconductor device according to claim 2, wherein the lead connecting portion includes: a lead-connecting-portion first side surface that intersects the lead-connecting-portion first surface and the lead-connecting-portion end surface and faces the second recess side surface; and a lead-connecting-portion second side surface that faces opposite to the lead-connecting-portion first side surface, and
  an area of a third contact region in which the lead-connecting-portion first side surface and solder are in contact with each other is larger than an area of a fourth contact region in which the lead-connecting-portion second side surface and solder are in contact with each other.

4. The semiconductor device according to claim 3, wherein the connecting portion recess is open on a side facing the lead-connecting-portion second side surface.

5. The semiconductor device according to claim 1, wherein a distance between the lead-connecting-portion first surface and the lead-connecting-portion second surface is smaller than a length of the lead-connecting-portion first surface in the thickness direction.

6. The semiconductor device according to claim 1, wherein the second lead includes a connecting portion side surface that faces the semiconductor element in the first direction and is offset toward the semiconductor element with respect to the first recess side surface.

7. The semiconductor device according to claim 6, wherein, in the first direction, a distance between the connecting portion side surface and the lead-connecting-portion first surface is not longer than a distance between the lead-connecting-portion second surface and the first recess side surface.

8. The semiconductor device according to claim 6, wherein the connecting portion side surface includes an end portion on a side of the connecting portion recess, and the end portion is formed with a protruding portion that protrudes toward the semiconductor element.

9. The semiconductor device according to claim 1, wherein a distance between the lead-connecting-portion second surface and the first recess side surface is not longer than a distance between the lead-connecting-portion first surface and the lead-connecting-portion second surface and is at least ⅓ of the distance between the lead-connecting-portion first surface and the lead-connecting-portion second surface.

10. The semiconductor device according to claim 1, further comprising a sealing resin that covers the semiconductor element, wherein the sealing resin includes: a resin main surface and a resin back surface that face mutually opposite sides in the thickness direction; and a resin side surface that connects the resin main surface and the resin back surface to each other,
  wherein the first lead and the second lead are exposed from the resin back surface.

11. The semiconductor device according to claim 10, wherein the at least one second lead comprises a plurality of second leads, and the plurality of second leads are disposed along the resin side surface.

12. The semiconductor device according to claim 10, wherein the at least one second lead comprises two second leads, and
  the connection lead includes two lead connecting portions and a linkage portion that connects the two lead connecting portions to the element connecting portion.

13. The semiconductor device according to claim 1, wherein the semiconductor element is a diode.

14. The semiconductor device according to claim 1, further comprising a third lead, wherein the semiconductor element includes a third electrode that is disposed on the element main surface and electrically connected to the third lead.

15. The semiconductor device according to claim 14, further comprising an additional connection lead joined to the third electrode and the third lead.

16. The semiconductor device according to claim 14, further comprising a bonding wire joined to the third electrode and the third lead.

17. The semiconductor device according to claim 14, wherein the semiconductor element is a transistor.

* * * * *